United States Patent
Frougier et al.

(10) Patent No.: US 11,527,535 B2
(45) Date of Patent: Dec. 13, 2022

(54) VARIABLE SHEET FORKFET DEVICE

(71) Applicant: INTERNATIONAL BUSINESS MACHINES CORPORATION, Armonk, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 108 days.

(21) Appl. No.: 17/248,342

(22) Filed: Jan. 21, 2021

(65) Prior Publication Data

US 2022/0231020 A1    Jul. 21, 2022

(51) Int. Cl.
*H01L 27/092* (2006.01)
*H01L 29/06* (2006.01)
*H01L 29/423* (2006.01)
*H01L 29/786* (2006.01)
*H01L 21/02* (2006.01)
(Continued)

(52) U.S. Cl.
CPC ...... *H01L 27/092* (2013.01); *H01L 21/02603* (2013.01); *H01L 21/823807* (2013.01); *H01L 29/0673* (2013.01); *H01L 29/42392* (2013.01); *H01L 29/66545* (2013.01); *H01L 29/66742* (2013.01); *H01L 29/78696* (2013.01); *H01L 2029/42388* (2013.01)

(58) Field of Classification Search
CPC ............. H01L 27/092; H01L 21/02603; H01L 21/823807; H01L 29/0673; H01L 29/42392; H01L 29/66545; H01L 29/66742; H01L 29/78696; H01L 2029/42388
USPC ........................................................ 257/351
See application file for complete search history.

(56) References Cited

U.S. PATENT DOCUMENTS 9,196,613 B2  11/2015  Basker
9,461,114 B2  10/2016  Obradovic
9,614,056 B2   4/2017  Xie
(Continued)

OTHER PUBLICATIONS

Weckx, et al., "Novel forksheet device architecture as ultimate logic scaling device towards 2nm," 2019 IEEE International Electron Devices Meeting (IEDM), Dec. 7-11, 2019 [accessed on Dec. 17, 2020], p. 36.5.1-36.5.4, IEEE, San Francisco, CA, USA, DOI: 10.1109/IEDM19573.2019.8993635, Retrieved from the Internet: <URL: https://ieeexplore.ieee.org/document/8993635>.

*Primary Examiner* — Tong-Ho Kim
(74) *Attorney, Agent, or Firm* — L. Jeffrey Kelly

(57) ABSTRACT

An embodiment of the invention may include a forkFET semiconductor structure, and the method of forming said structure. The structure may include a first FET device and a second FET device separated by a vertical dielectric pillar. The first FET device may include a first plurality of horizontal sheet channels. The second FET device may include a second plurality of horizontal sheet channels. The first plurality of horizontal sheet channels contains more horizontal sheets than the second plurality of horizontal sheet channels. This may enable adjustment of $W_{\mathit{eff}}$ for different devices on different sides of the pillar or different thicknesses of dielectrics used for the device.

17 Claims, 22 Drawing Sheets

(51) Int. Cl.
    *H01L 21/8238*     (2006.01)
    *H01L 29/66*     (2006.01)

(56) References Cited

U.S. PATENT DOCUMENTS

| | | |
|---|---|---|
| 10,074,575 B1 | 9/2018 | Guillorn |
| 10,170,484 B1 | 1/2019 | Sung |
| 10,263,075 B2 | 4/2019 | Bi |
| 10,290,549 B2 | 5/2019 | Xie |
| 10,381,459 B2 | 8/2019 | Xie |
| 10,396,169 B2 | 8/2019 | Cheng |
| 10,510,620 B1 | 12/2019 | Chanemougame |
| 10,566,248 B1 | 2/2020 | Chanemougame |
| 10,573,755 B1 | 2/2020 | Frougier |
| 10,714,391 B2 | 7/2020 | Smith |
| 2015/0091059 A1* | 4/2015 | Hung .................. H01L 29/785 257/192 |
| 2017/0104060 A1* | 4/2017 | Balakrishnan .............................. H01L 21/823412 |
| 2019/0288117 A1 | 9/2019 | Xie |
| 2019/0348530 A1* | 11/2019 | Ando ................ H01L 29/42392 |
| 2020/0043926 A1 | 2/2020 | Ohtou |
| 2020/0105762 A1 | 4/2020 | Xiao |
| 2020/0185539 A1* | 6/2020 | Lee .................. H01L 21/02532 |
| 2021/0391222 A1* | 12/2021 | Xie ................. H01L 21/823814 |
| 2021/0408009 A1* | 12/2021 | Zheng ............... H01L 29/66439 |

\* cited by examiner

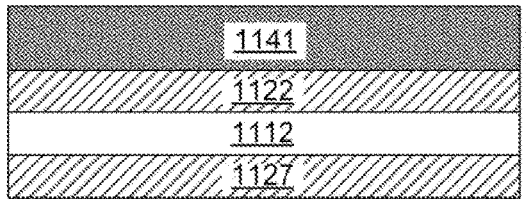
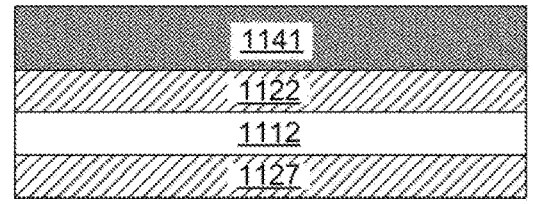
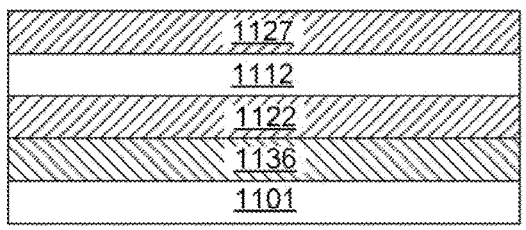
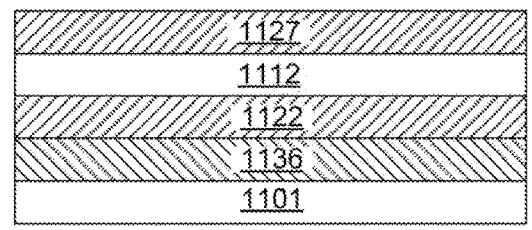
FIG. 16A
FIG. 16B
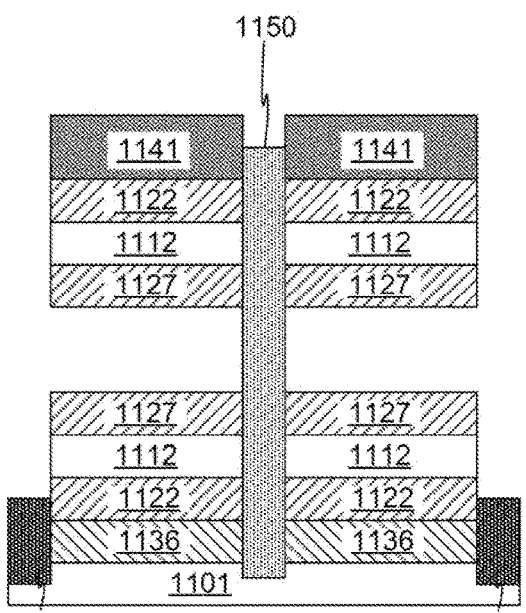
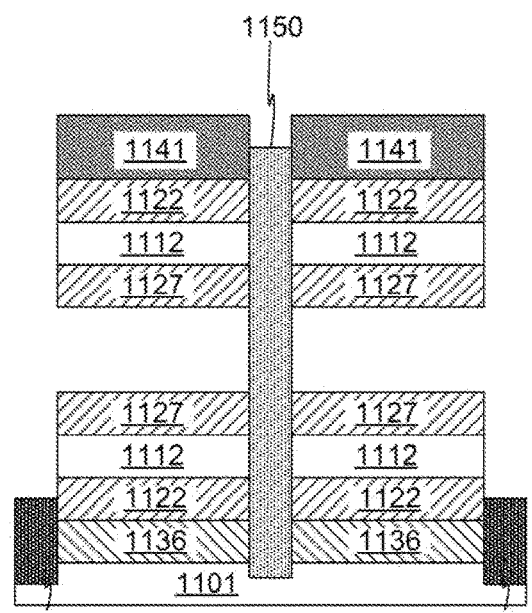
FIG. 16C
FIG. 16D

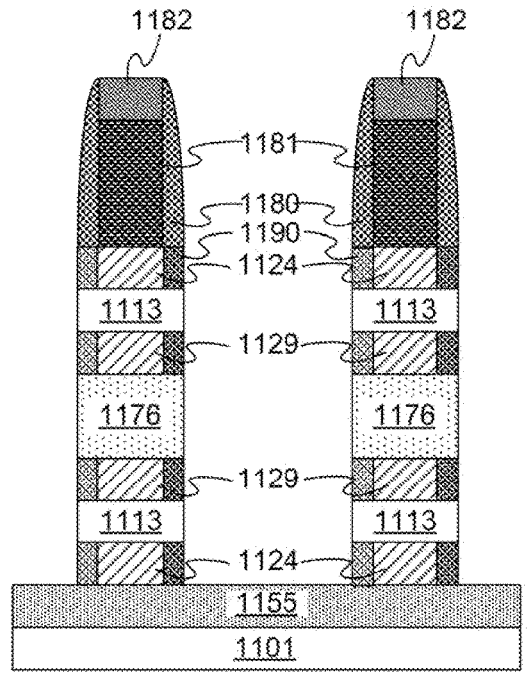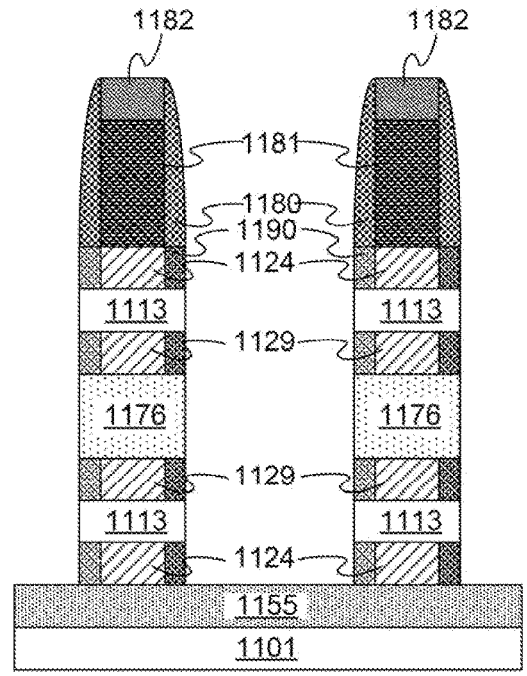
FIG. 19A                FIG. 19B
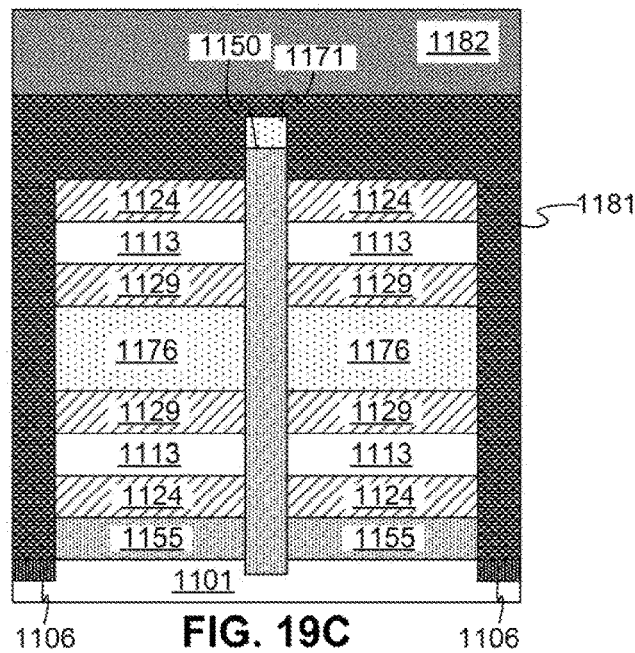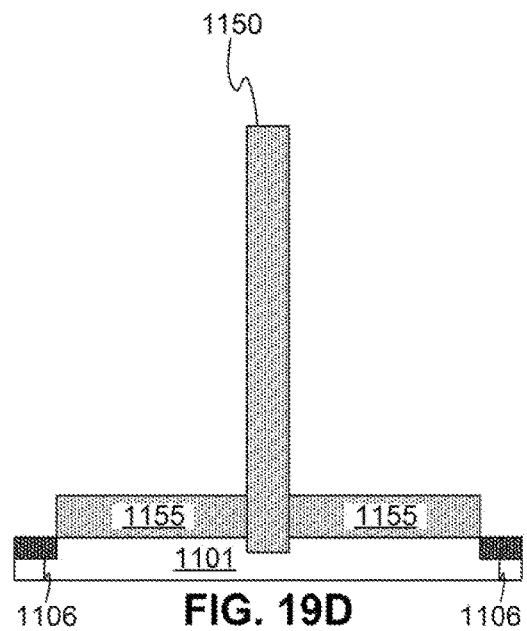
FIG. 19C                FIG. 19D

VARIABLE SHEET FORKFET DEVICE

BACKGROUND

The present invention relates to semiconductor devices, and more specifically, to forkFET transistors.

Nanosheet field effect transistors (FETs) are an emerging technology which may provide solutions to field effect transistor (FET) scaling problems at, and below, the 7 nm node. Nanosheet FET structures may include a plurality of sheets gated on at least two sides of each of the semiconductor fins, as well as a source region and a drain region adjacent to the fin on opposite sides of the gate. FET structures having n-type source and drain regions may be referred to as nFETs, and FET structures having p-type source and drain regions may be referred to as pFETs.

The degree of control of electrical properties in the channel region of a field effect transistor is a predominant factor determining design characteristics. A wrap-all-around gate, such as in a nanosheet field effect transistor, is a configuration that enhances control of the electronic transport in the channel region of a field effect transistor. However, integration schemes may include a variety of tradeoffs to the final devices.

BRIEF SUMMARY

An embodiment of the invention may include a forkFET semiconductor structure. The structure may include a first FET device and a second FET device separated by a vertical dielectric pillar. The first FET device may include a first plurality of horizontal sheet channels. The second FET device may include a second plurality of horizontal sheet channels. The first plurality of horizontal sheet channels contains more horizontal sheets than the second plurality of horizontal sheet channels. This may enable adjustment of $W_{eff}$ for different devices on different sides of the pillar or different thicknesses of dielectrics used for the device.

In an embodiment the structure may also include a bottom dielectric isolation layer located beneath first FET and the second FET. The bottom dielectric isolation layer may be in contact with the vertical dielectric pillar. This may reduce device leakage to the substrate.

In an embodiment the structure may also include a bottom spacer of the second FET device may include at least one material seam in a dielectric of the bottom spacer. This may be a result of the formation of a structure that enables adjustment of $W_{eff}$ for different devices on different sides of the pillar or different thicknesses of dielectrics used for the device.

In an embodiment the structure may also include a first top sheet of the first plurality of horizontal sheet channels and a second top sheet of the second plurality of horizontal sheet channels are substantially coplanar. This may be a result of the formation of a structure that enables adjustment of $W_{eff}$ for different devices on different sides of the pillar or different thicknesses of dielectrics used for the device.

In an embodiment the structure may also include a first bottom sheet of the first plurality of horizontal sheet channels and a second bottom sheet of the second plurality of horizontal sheet channels are substantially coplanar. This may be a result of the formation of a structure that enables adjustment of $W_{eff}$ for different devices on different sides of the pillar or different thicknesses of dielectrics used for the device.

In an embodiment the structure may also include the first FET device is a pFET device, and wherein the second FET device is an nFET device. This may be a result of the formation of a structure that enables adjustment of $W_{eff}$ for different devices on different sides of the pillar.

In an embodiment the structure may also include a first thickness of a first gate dielectric on the first FET device is less than a second thickness of a second gate dielectric on the second FET device. This may enable different types of devices (e.g., logic and I/O) to be formed on the same forkFET.

In an embodiment the structure may also include a first surface of a substrate located beneath a first source/drain region of the first FET is higher than a second surface of the substrate located beneath a second source/drain region of the second FET. This may be a result of the formation of a structure that enables adjustment of $W_{eff}$ for different devices on different sides of the pillar or different thicknesses of dielectrics used for the device.

An embodiment of the invention may include a two semiconductor structures on a device. The structure may include a first FET device and a second FET device separated by a vertical dielectric pillar. The first FET device may include a first plurality of horizontal sheet channels. The second FET device may include a second plurality of horizontal sheet channels separated by a vertical dielectric pillar. The first plurality of horizontal sheet channels contains more horizontal sheets than the second plurality of horizontal sheet channels. This may enable adjustment of $W_{eff}$ for the different devices or different thicknesses of dielectrics used for the devices.

In an embodiment the structure may also include a bottom dielectric isolation layer located beneath first FET and the second FET. The bottom dielectric isolation layer may be in contact with the vertical dielectric pillar. This may reduce device leakage to the substrate.

In an embodiment the structure may also include a bottom spacer of the second FET device may include at least one material seam in a dielectric of the bottom spacer. This may be a result of the formation of a structure that enables adjustment of $W_{eff}$ for different devices on different sides of the pillar or different thicknesses of dielectrics used for the device.

In an embodiment the structure may also include a first top sheet of the first plurality of horizontal sheet channels and a second top sheet of the second plurality of horizontal sheet channels are substantially coplanar. This may be a result of the formation of a structure that enables adjustment of $W_{eff}$ for different devices on different sides of the pillar or different thicknesses of dielectrics used for the device.

In an embodiment the structure may also include a first bottom sheet of the first plurality of horizontal sheet channels and a second bottom sheet of the second plurality of horizontal sheet channels are substantially coplanar. This may be a result of the formation of a structure that enables adjustment of $W_{eff}$ for different devices on different sides of the pillar or different thicknesses of dielectrics used for the device.

In an embodiment the structure may also include the first FET device is a pFET device, and wherein the second FET device is an nFET device. This may be a result of the formation of a structure that enables adjustment of $W_{eff}$ for different devices on different sides of the pillar.

In an embodiment the structure may also include a first thickness of a first gate dielectric on the first FET device is less than a second thickness of a second gate dielectric on the second FET device. This may enable different types of devices (e.g., logic and I/O) to be formed on the same forkFET.

In an embodiment the structure may also include a first surface of a substrate located beneath a first source/drain region of the first FET is higher than a second surface of the substrate located beneath a second source/drain region of the second FET. This may be a result of the formation of a structure that enables adjustment of $W_{eff}$ for different devices on different sides of the pillar or different thicknesses of dielectrics used for the device.

An embodiment of the invention may include a method of forming a semiconductor structure. The method may include removing a layer of a plurality of material layers from a material stack. The layer is between two material layers. The layer is the same material as a layer retained in the material stack. This may enable formation of a structure that enables adjustment of $W_{eff}$ for different devices or different thicknesses of dielectrics used for the device.

An embodiment of the method may include a material stack having a plurality first layers of a first material, a plurality of second layers of a second material, and a plurality of third layers of a third material. The first material, the second material, and the third material are different materials. The layer removed is from the plurality of first layers. This may enable formation of a structure that enables adjustment of $W_{eff}$ for different devices or different thicknesses of dielectrics used for the device.

An embodiment of the method may include two layers of the plurality of third layers located in direct contact above and below the first layer. This may enable formation of a structure that enables adjustment of $W_{eff}$ for different devices or different thicknesses of dielectrics used for the device.

An embodiment of the method may include removing the two layers of the plurality of third layers to enable removing the layer. This may enable formation of a structure that enables adjustment of $W_{eff}$ for different devices or different thicknesses of dielectrics used for the device.

An embodiment of the method may include forming a dummy gate above a gate region of the material stack. The method may include removing the second material and the third material in the gate region. The method may include forming a replacement metal gate around the plurality of first layers remaining. This may enable formation of a structure that enables adjustment of $W_{eff}$ for different devices or different thicknesses of dielectrics used for the device.

An embodiment of the invention may include a method of forming a semiconductor structure. The method may include forming a dielectric material in a material stack, wherein the material stack comprises a plurality of material layers. The method may include masking a first side of the material stack. The method may include removing a layer of the plurality of material layers from the material stack on a second side, where the layer is the same material as a layer retained in the material stack. This may enable formation of a structure that enables adjustment of $W_{eff}$ for different devices or different thicknesses of dielectrics used for the device.

An embodiment of the method may include a material stack having a plurality first layers of a first material, a plurality of second layers of a second material, and a plurality of third layers of a third material. The first material, the second material, and the third material are different materials. The layer removed is from the plurality of first layers. This may enable formation of a structure that enables adjustment of $W_{eff}$ for different devices or different thicknesses of dielectrics used for the device.

An embodiment of the method may include two layers of the plurality of third layers located in direct contact above and below the first layer. This may enable formation of a structure that enables adjustment of $W_{eff}$ for different devices or different thicknesses of dielectrics used for the device.

An embodiment of the method may include removing the two layers of the plurality of third layers to enable removing the layer. This may enable formation of a structure that enables adjustment of $W_{eff}$ for different devices or different thicknesses of dielectrics used for the device.

An embodiment of the method may include forming a dummy gate above a gate region of the material stack. The method may include removing the second material and the third material in the gate region. The method may include forming a replacement metal gate around the plurality of first layers remaining. This may enable formation of a structure that enables adjustment of Way for different devices or different thicknesses of dielectrics used for the device.

BRIEF DESCRIPTION OF THE DRAWINGS

FIG. 16a is a cross-sectional depiction along the $X_1$ axis following removal of a semiconductor sheet from the material stack, according to an example embodiment;

FIG. 16b is a cross-sectional depiction along the $X_2$ axis following removal of a semiconductor sheet from the material stack, according to an example embodiment;

FIG. 16c is a cross-sectional depiction along the $Y_1$ axis following removal of a semiconductor sheet from the material stack, according to an example embodiment;

FIG. 16d is a cross-sectional depiction along the $Y_2$ axis following removal of a semiconductor sheet from the material stack, according to an example embodiment;

FIG. 19a is a cross-sectional depiction along the $X_1$ axis following pullback of the dummy layers of the material stack and lower spacer formation, according to an example embodiment;

FIG. 19b is a cross-sectional depiction along the $X_2$ axis following pullback of the dummy layers of the material stack and lower spacer formation, according to an example embodiment;

FIG. 19c is a cross-sectional depiction along the $Y_1$ axis following pullback of the dummy layers of the material stack and lower spacer formation, according to an example embodiment;

FIG. 19d is a cross-sectional depiction along the $Y_2$ axis following pullback of the dummy layers of the material stack and lower spacer formation, according to an example embodiment;

Figure 1:
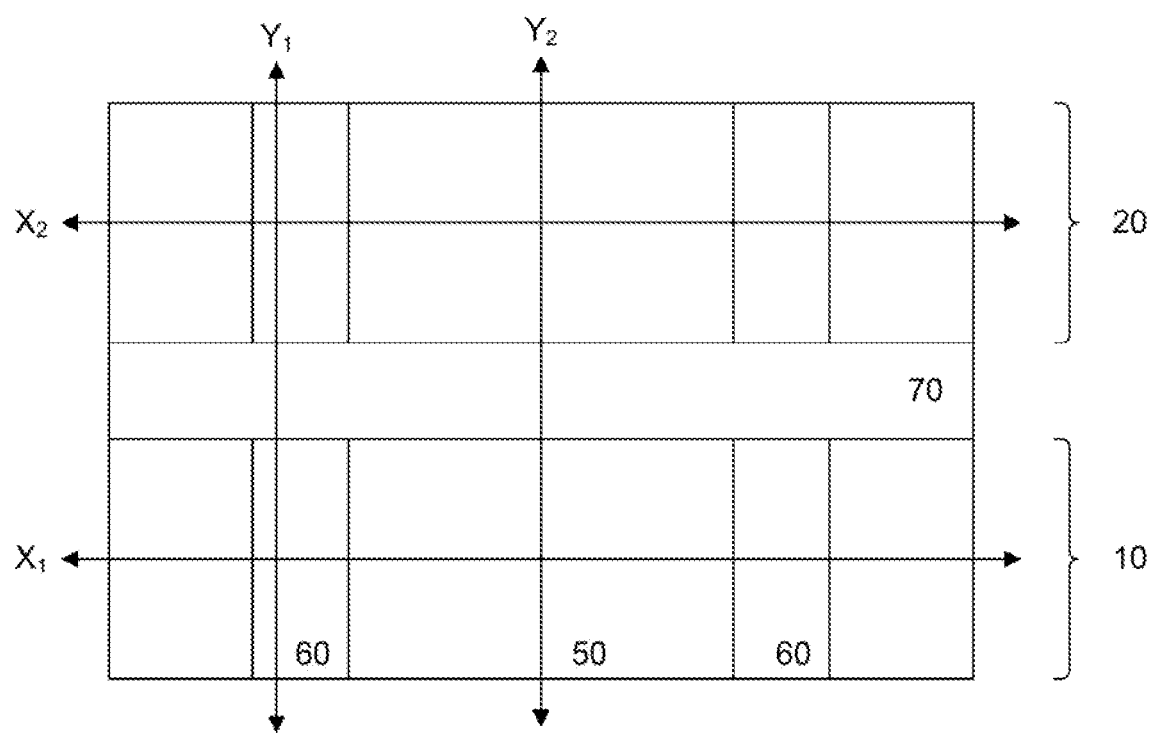
FIG. 1 is a top down depiction of the cross-sections of a semiconductor device along different areas of the device, according to an example embodiment.
Figure 2A:
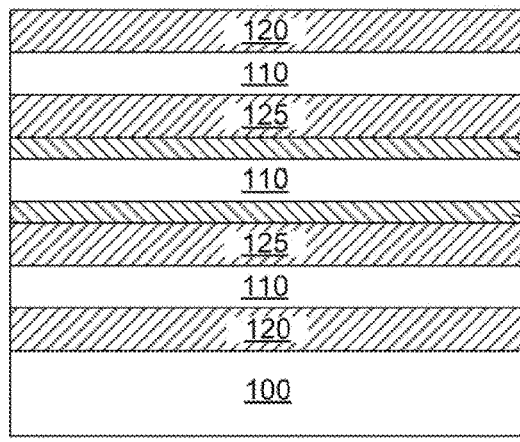
FIG. 2a is a cross-sectional depiction along the $X_1$ axis of a material stack, according to an example embodiment.
Figure 2B:
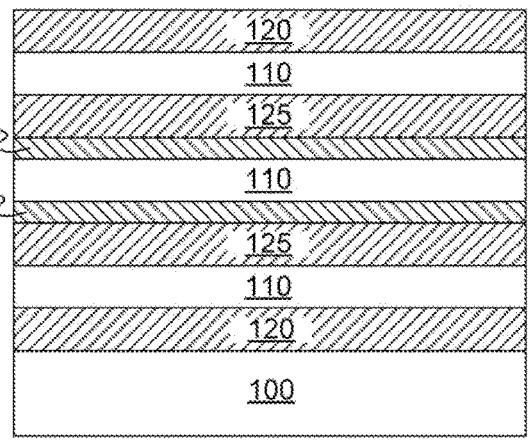
FIG. 2b is a cross-sectional depiction along the $X_2$ axis of a material stack, according to an example embodiment.
Figure 2C:
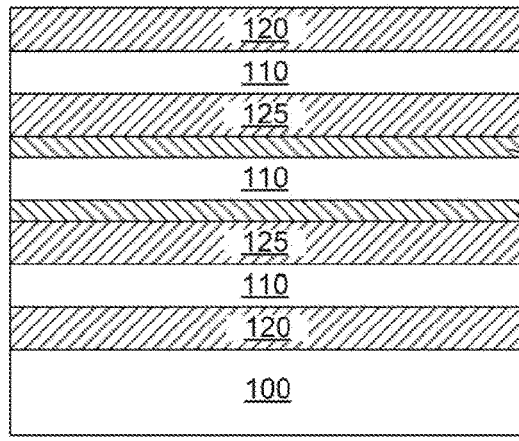
FIG. 2c is a cross-sectional depiction along the $Y_1$ axis of a material stack, according to an example embodiment.
Figure 2D:
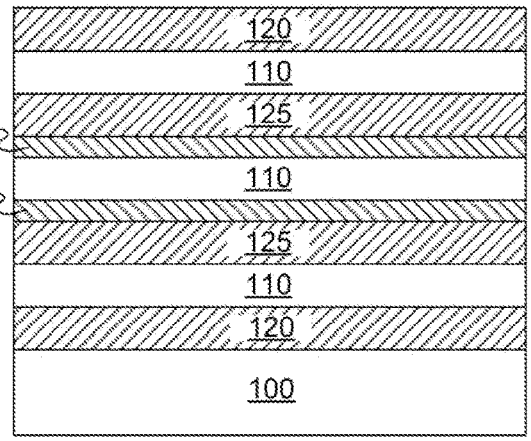
FIG. 2d is a cross-sectional depiction along the $Y_2$ axis of a material stack, according to an example embodiment.
Figure 3A:
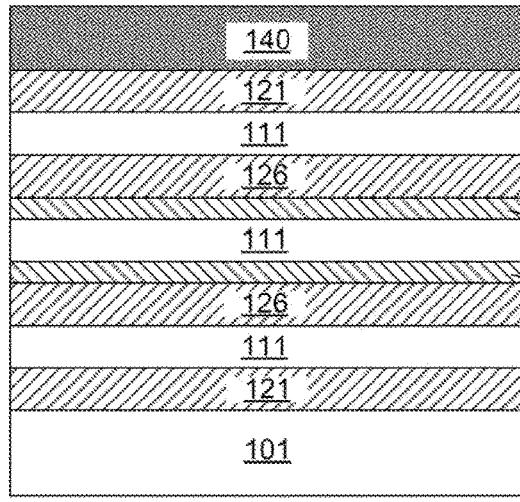
FIG. 3a is a cross-sectional depiction along the $X_1$ axis following STI formation, according to an example embodiment.
Figure 3B:
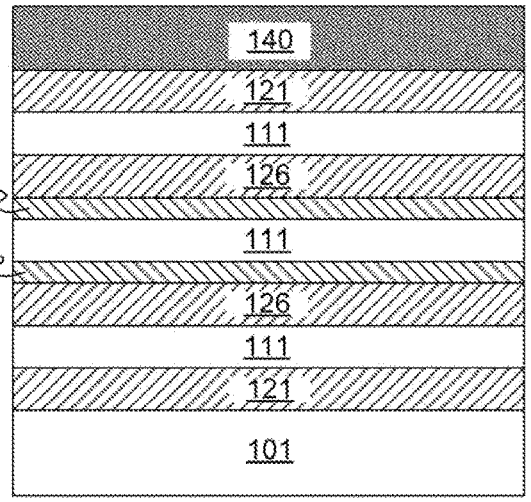
FIG. 3b is a cross-sectional depiction along the $X_2$ axis following STI formation, according to an example embodiment.
Figure 3C:
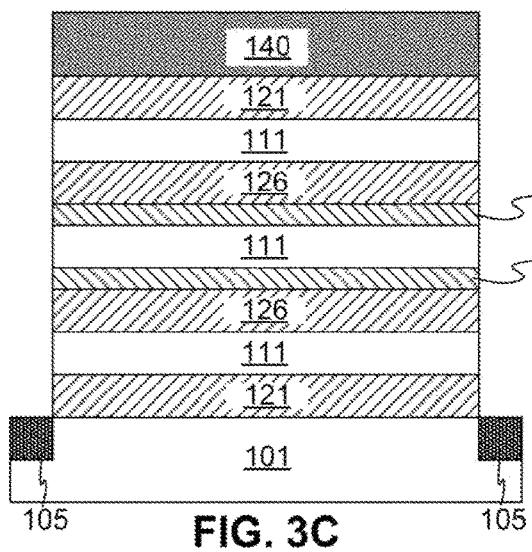
FIG. 3c is a cross-sectional depiction along the $Y_1$ axis following STI formation, according to an example embodiment.
Figure 3D:
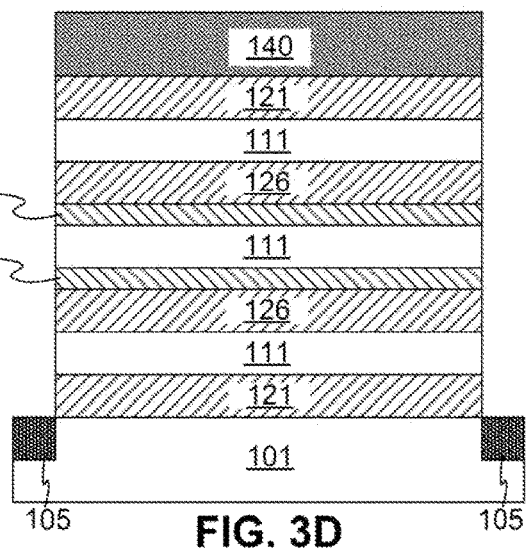
FIG. 3d is a cross-sectional depiction along the $Y_2$ axis following STI formation, according to an example embodiment.
Figure 4A:
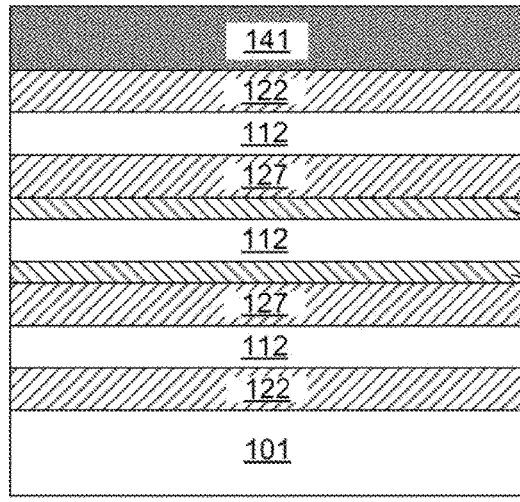
FIG. 4a is a cross-sectional depiction along the $X_1$ axis following dielectric pillar formation, according to an example embodiment.
Figure 4B:
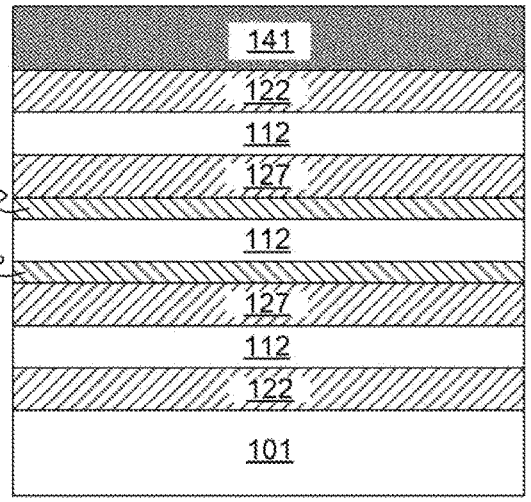
FIG. 4b is a cross-sectional depiction along the $X_2$ axis following dielectric pillar formation, according to an example embodiment.
Figure 4C:
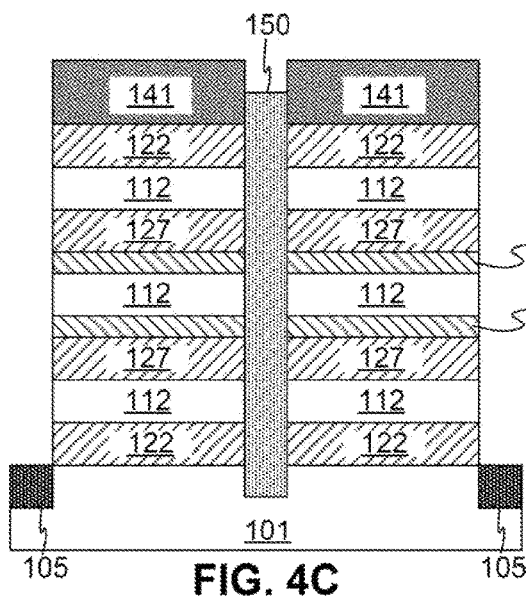
FIG. 4c is a cross-sectional depiction along the $Y_1$ axis following dielectric pillar formation, according to an example embodiment.
Figure 4D:
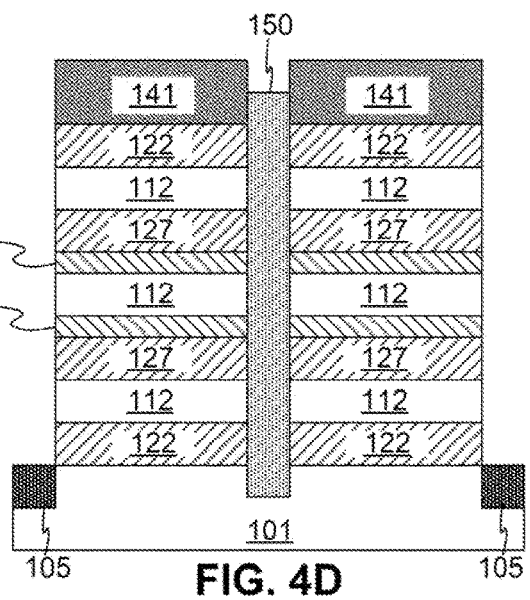
FIG. 4d is a cross-sectional depiction along the $Y_2$ axis following dielectric pillar formation, according to an example embodiment.
Figure 5A:
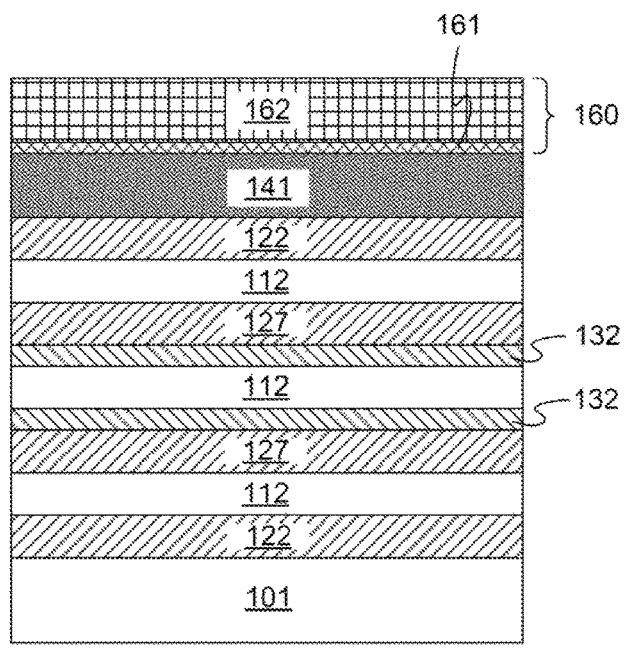
FIG. 5a is a cross-sectional depiction along the $X_1$ axis following masking a pFET region, according to an example embodiment.
Figure 5B:
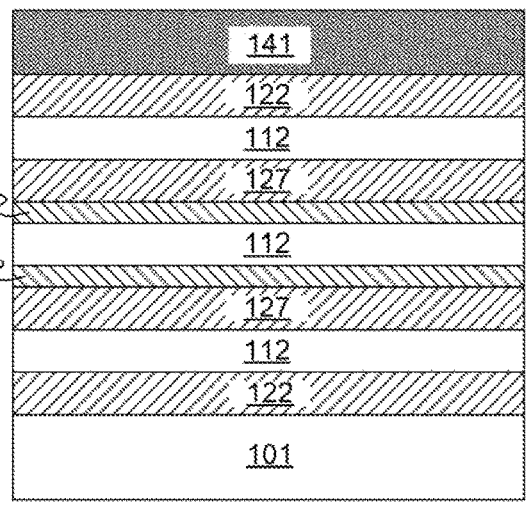
FIG. 5b is a cross-sectional depiction along the $X_2$ axis following masking a pFET region, according to an example embodiment.
Figure 5C:
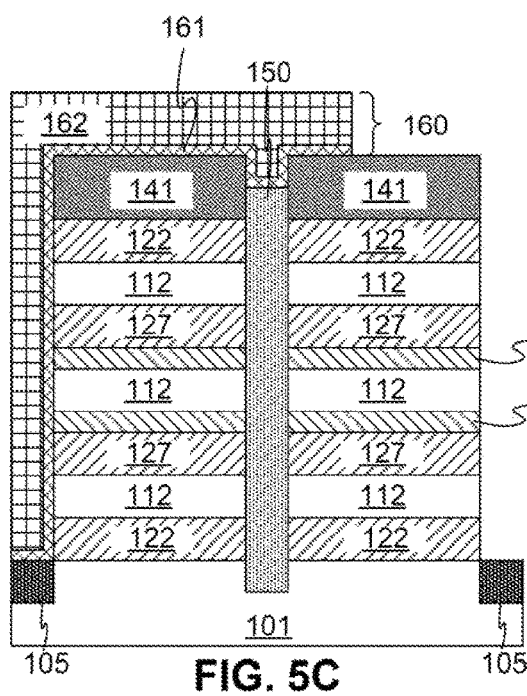
FIG. 5c is a cross-sectional depiction along the $Y_1$ axis following masking a pFET region, according to an example embodiment.
Figure 5D:
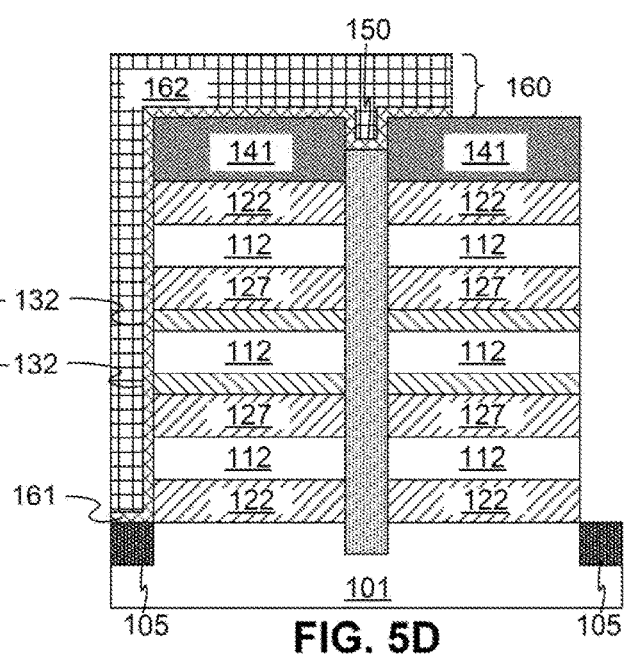
FIG. 5d is a cross-sectional depiction along the $Y_2$ axis following masking a pFET region, according to an example embodiment.
Figure 6A:
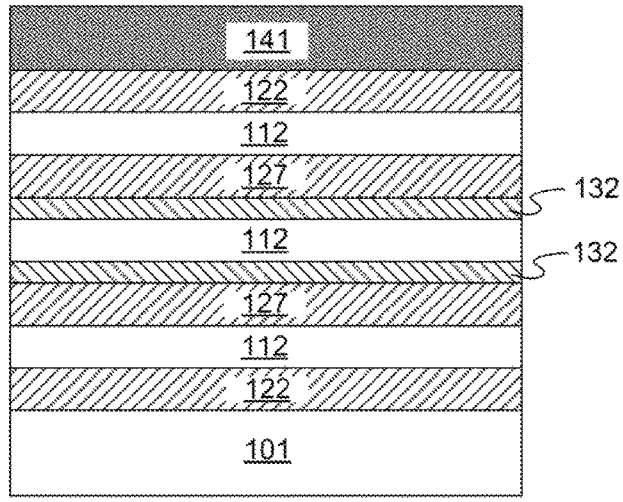
FIG. 6a is a cross-sectional depiction along the $X_1$ axis following removal of a semiconductor sheet from the material stack, according to an example embodiment.
Figure 6B:
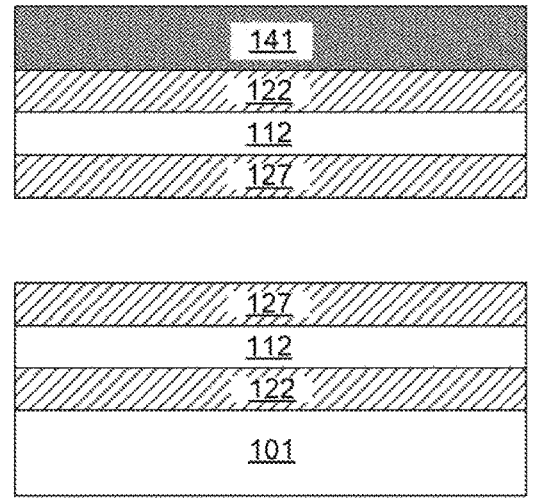
FIG. 6b is a cross-sectional depiction along the $X_2$ axis following removal of a semiconductor sheet from the material stack, according to an example embodiment.
Figure 6C:
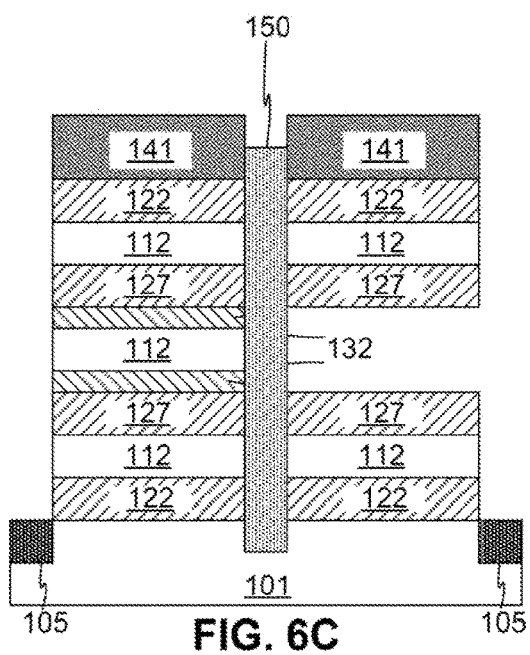
FIG. 6c is a cross-sectional depiction along the $Y_1$ axis following removal of a semiconductor sheet from the material stack, according to an example embodiment.
Figure 6D:
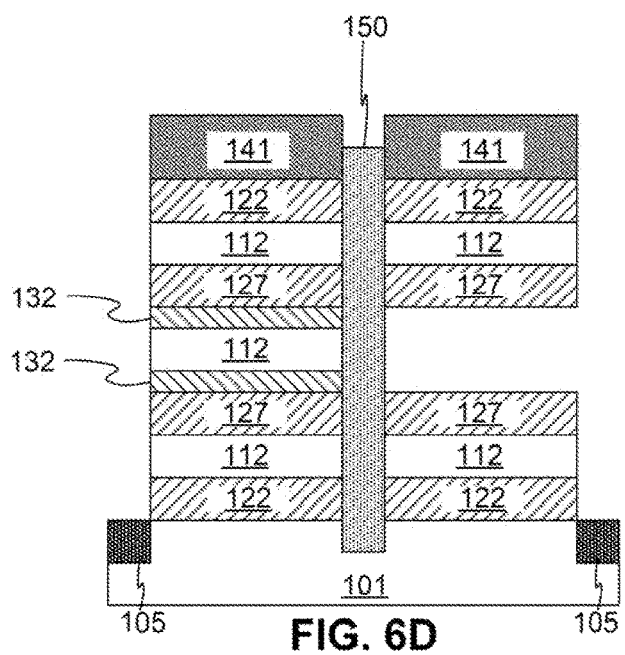
FIG. 6d is a cross-sectional depiction along the $Y_2$ axis following removal of a semiconductor sheet from the material stack, according to an example embodiment.
Figure 7A:
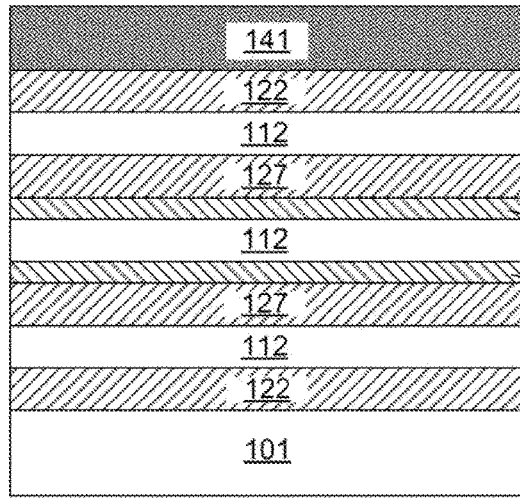
FIG. 7a is a cross-sectional depiction along the $X_1$ axis following removal of the hardmask and forming a dummy spacer where the semiconductor sheet was removed, according to an example embodiment.
Figure 7B:
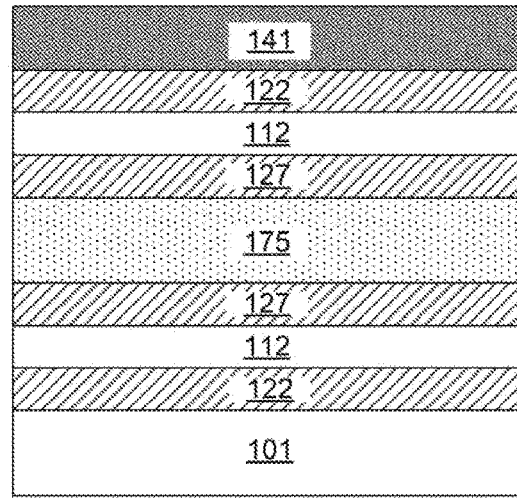
FIG. 7b is a cross-sectional depiction along the $X_2$ axis following removal of the hardmask and forming a dummy spacer where the semiconductor sheet was removed, according to an example embodiment.
Figure 7C:
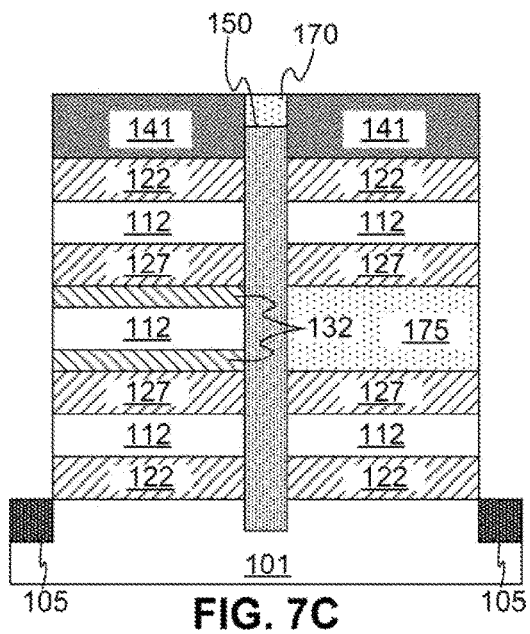
FIG. 7c is a cross-sectional depiction along the $Y_1$ axis following removal of the hardmask and forming a dummy spacer where the semiconductor sheet was removed, according to an example embodiment.
Figure 7D:
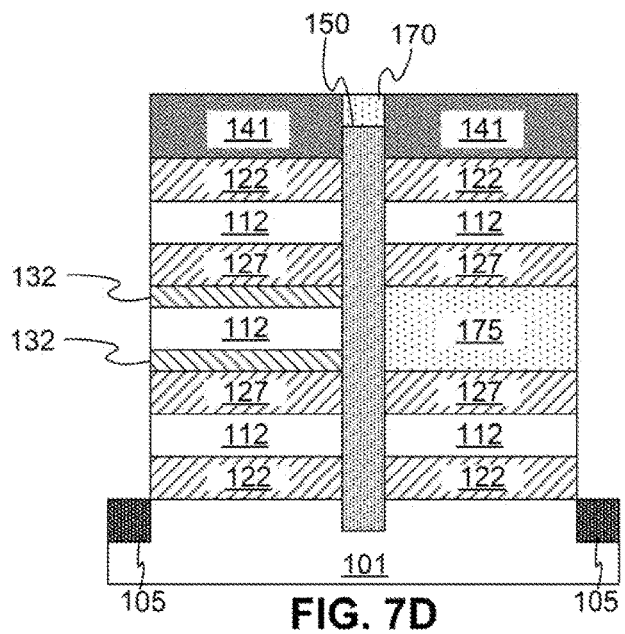
FIG. 7d is a cross-sectional depiction along the $Y_2$ axis following removal of the hardmask and forming a dummy spacer where the semiconductor sheet was removed, according to an example embodiment.
Figure 8A:
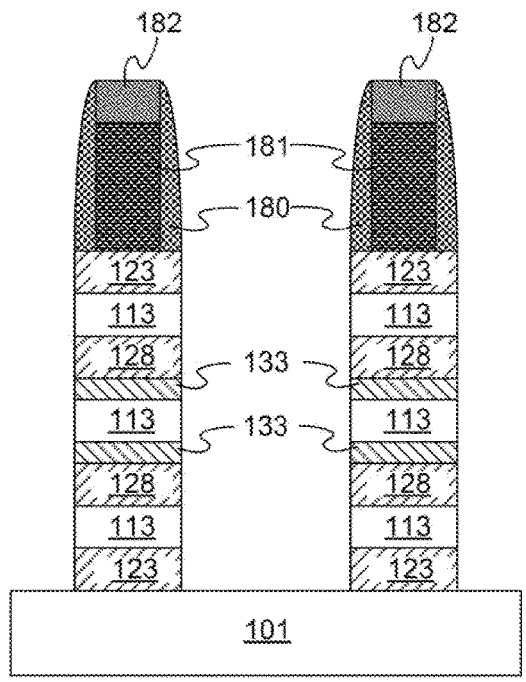
FIG. 8a is a cross-sectional depiction along the $X_1$ axis following forming a dummy gate and patterning the material stack, according to an example embodiment.
Figure 8B:
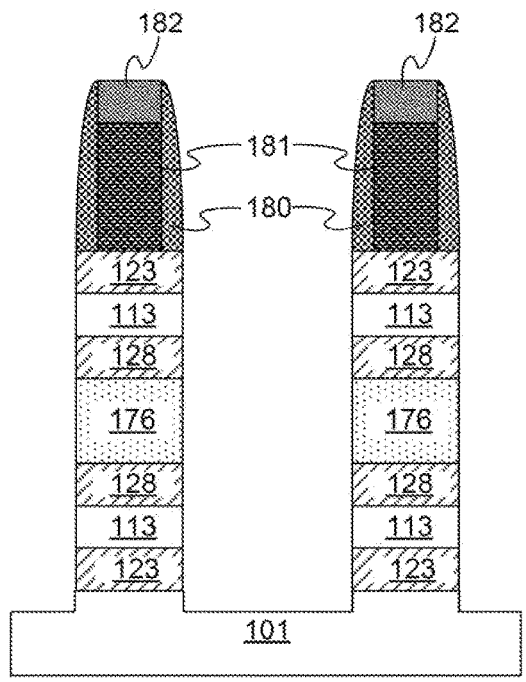
FIG. 8b is a cross-sectional depiction along the $X_2$ axis following forming a dummy gate and patterning the material stack, according to an example embodiment.
Figure 8C:
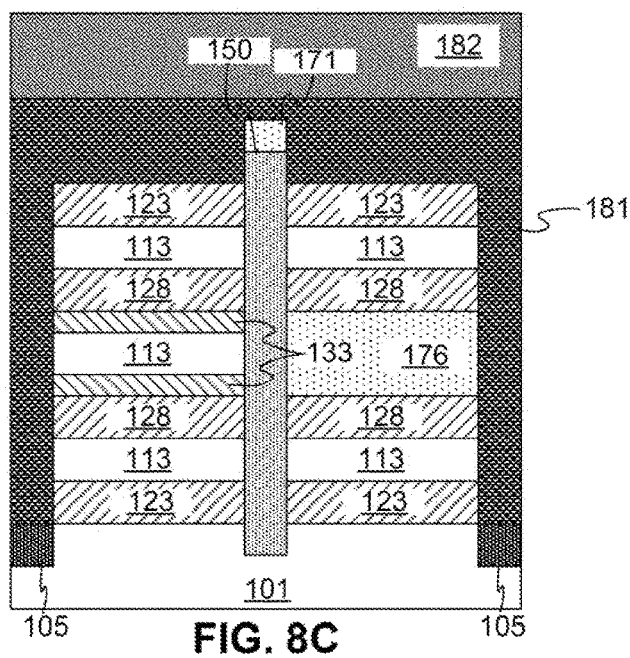
FIG. 8c is a cross-sectional depiction along the $Y_1$ axis following forming a dummy gate and patterning the material stack, according to an example embodiment.
Figure 8D:
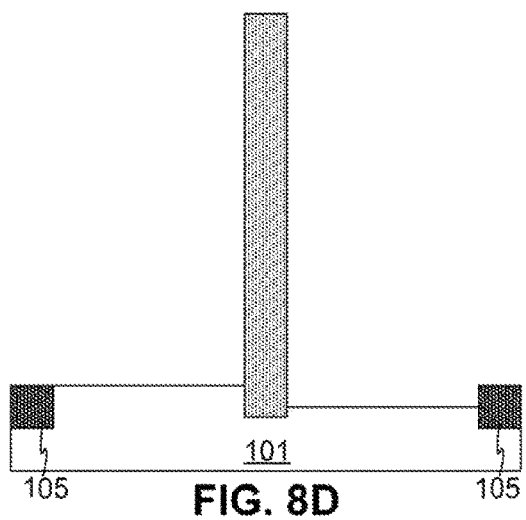
FIG. 8d is a cross-sectional depiction along the $Y_2$ axis following forming a dummy gate and patterning the material stack, according to an example embodiment.
Figure 9A:
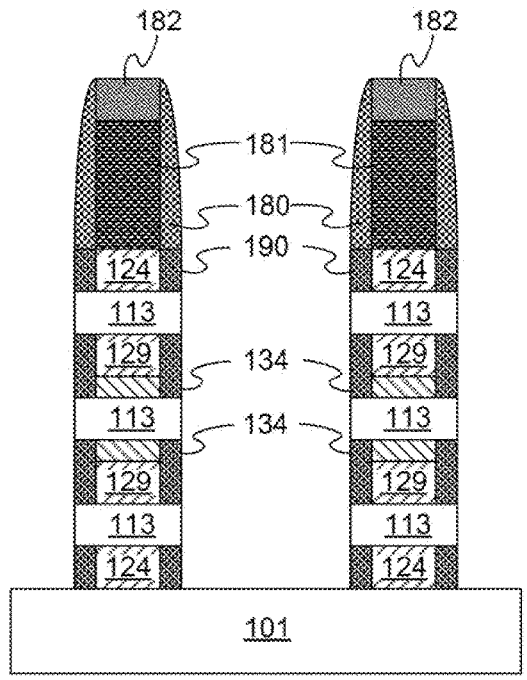
FIG. 9a is a cross-sectional depiction along the $X_1$ axis following pullback of the dummy layers of the material stack and lower spacer formation, according to an example embodiment.
Figure 9B:
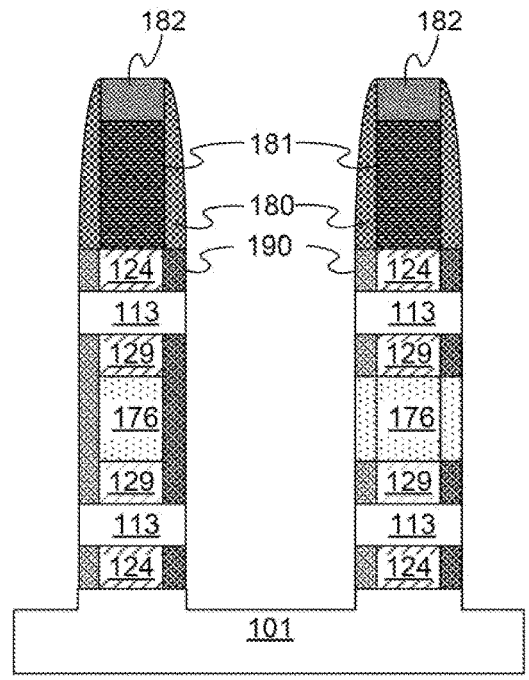
FIG. 9b is a cross-sectional depiction along the $X_2$ axis following pullback of the dummy layers of the material stack and lower spacer formation, according to an example embodiment.
Figure 9C:
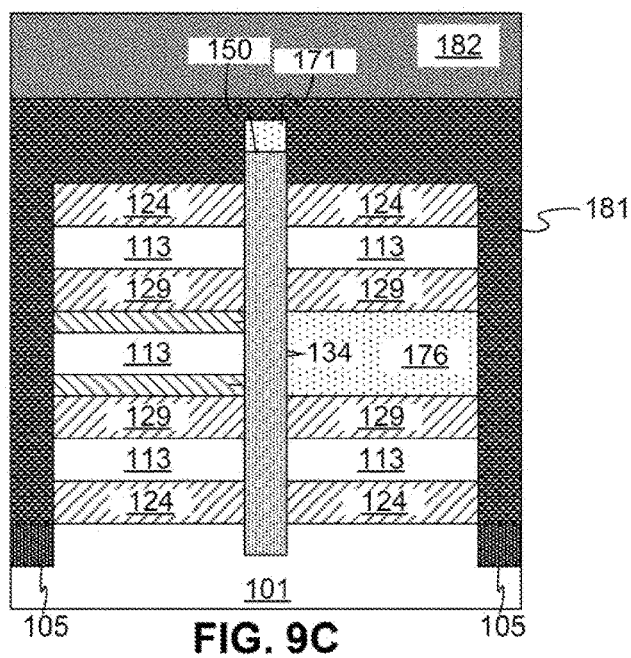
FIG. 9c is a cross-sectional depiction along the $Y_1$ axis following pullback of the dummy layers of the material stack and lower spacer formation, according to an example embodiment.
Figure 9D:
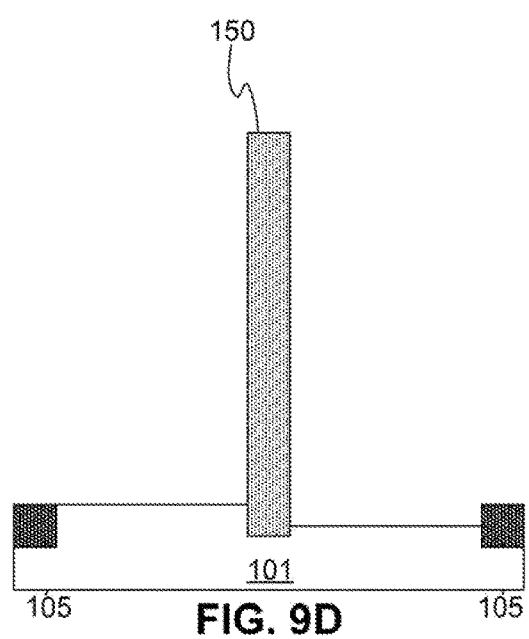
FIG. 9d is a cross-sectional depiction along the $Y_2$ axis following pullback of the dummy layers of the material stack and lower spacer formation, according to an example embodiment.
Figure 10A:
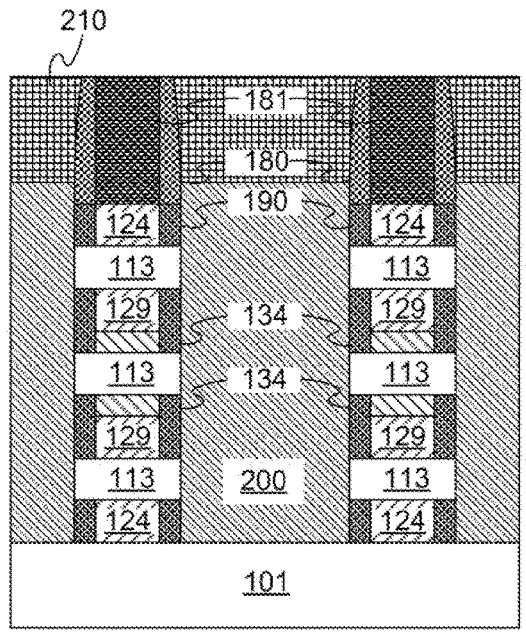
FIG. 10a is a cross-sectional depiction along the $X_1$ axis following epitaxial formation of source/drain regions, according to an example embodiment.
Figure 10B:
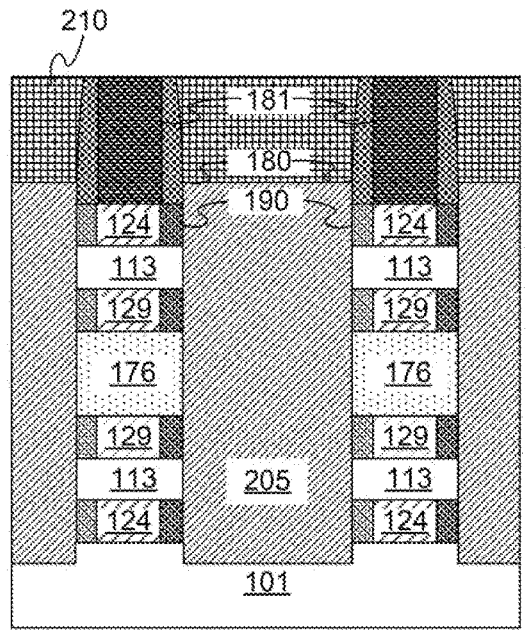
FIG. 10b is a cross-sectional depiction along the $X_2$ axis following epitaxial formation of source/drain regions, according to an example embodiment.
Figure 10C:
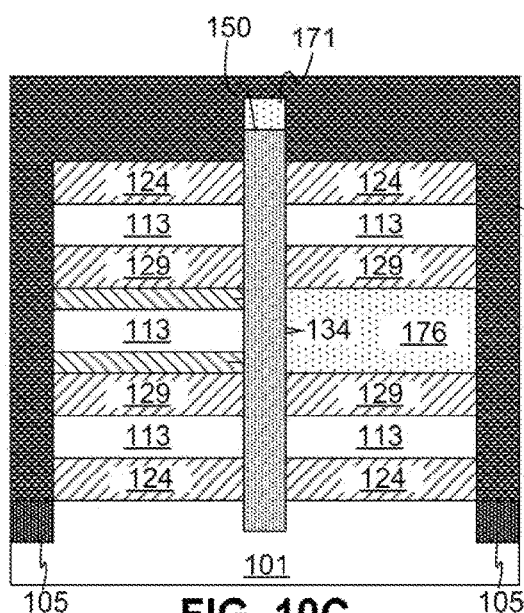
FIG. 10c is a cross-sectional depiction along the $Y_1$ axis following epitaxial formation of source/drain regions, according to an example embodiment.
Figure 10D:
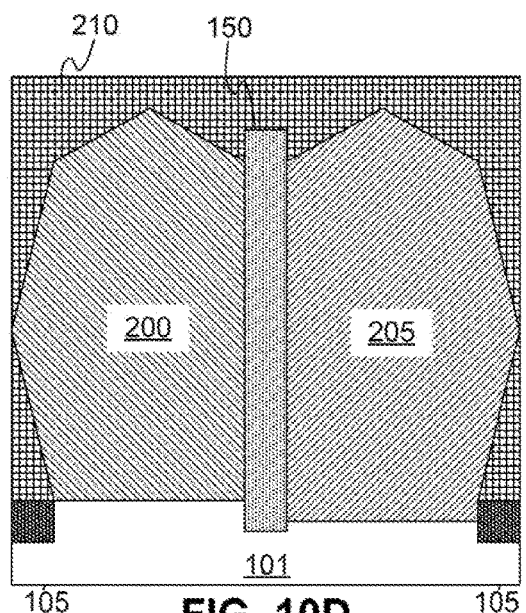
FIG. 10d is a cross-sectional depiction along the $Y_2$ axis following epitaxial formation of source/drain regions, according to an example embodiment.
Figure 11A:
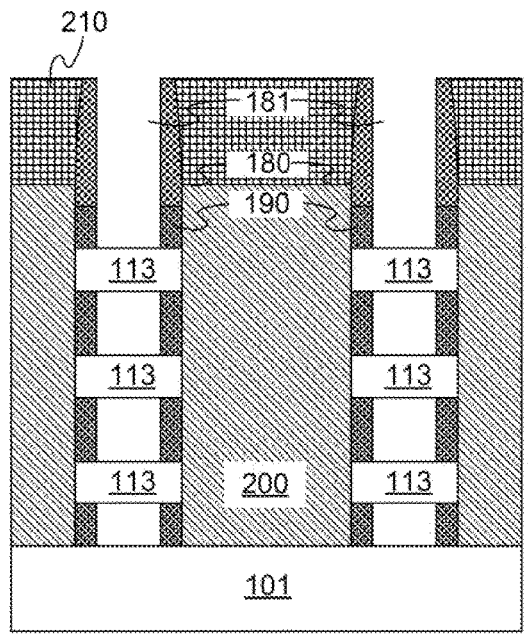
FIG. 11a is a cross-sectional depiction along the $X_1$ axis following removal of the dummy gate and dummy layers, according to an example embodiment.
Figure 11B:
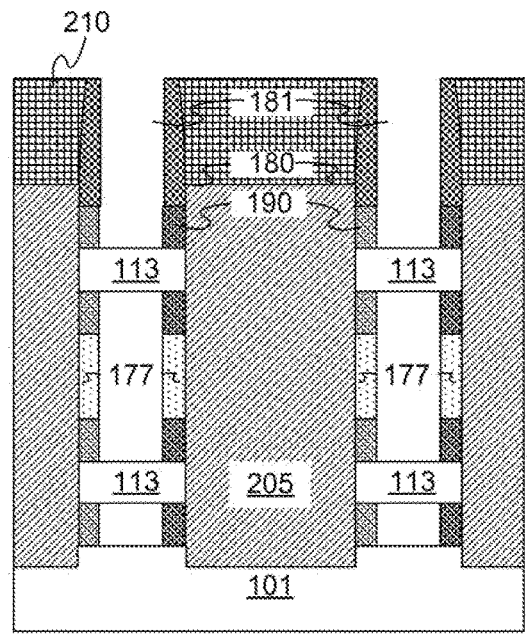
FIG. 11b is a cross-sectional depiction along the $X_2$ axis following removal of the dummy gate and dummy layers, according to an example embodiment.
Figure 11C:
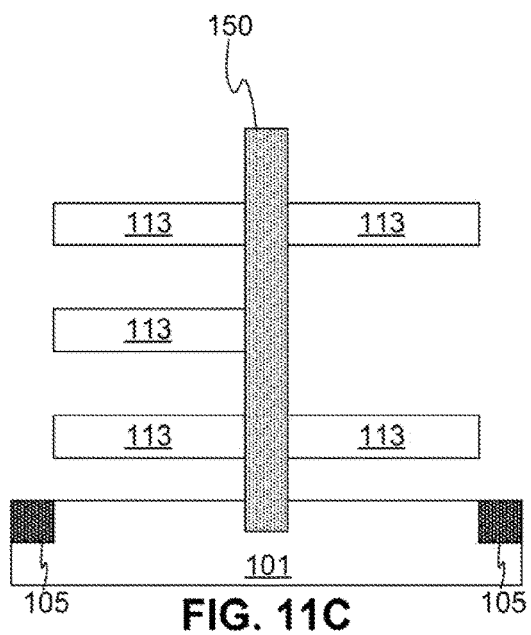
FIG. 11c is a cross-sectional depiction along the $Y_1$ axis following removal of the dummy gate and dummy layers, according to an example embodiment.
Figure 11D:
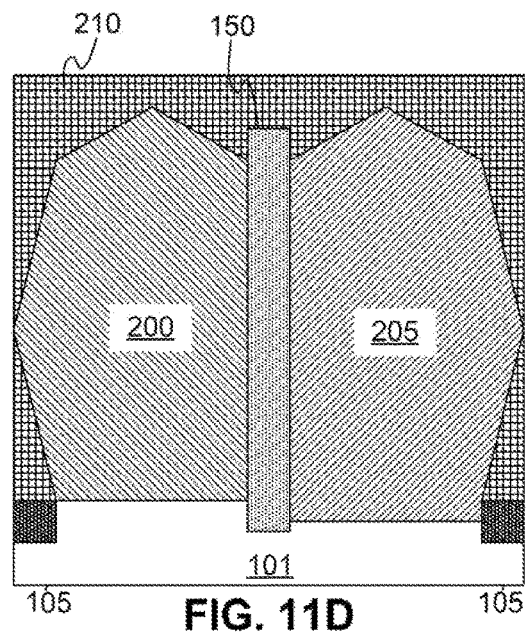
FIG. 11d is a cross-sectional depiction along the $Y_2$ axis following removal of the dummy gate and dummy layers, according to an example embodiment.
Figure 12A:
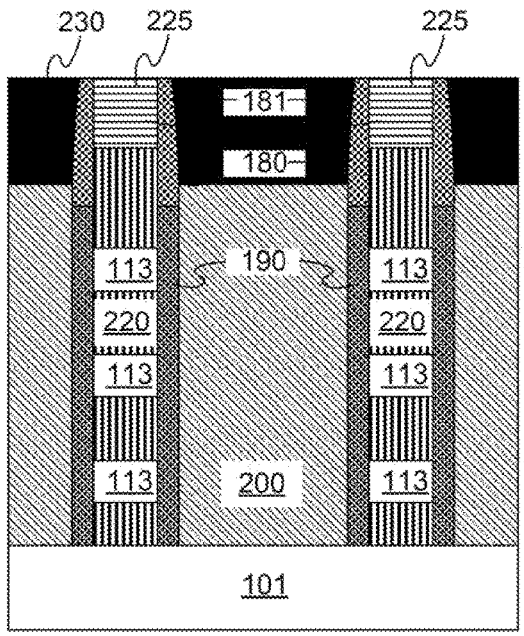
FIG. 12a is a cross-sectional depiction along the $X_1$ axis following gate deposition and contact formation, according to an example embodiment.
Figure 12B:
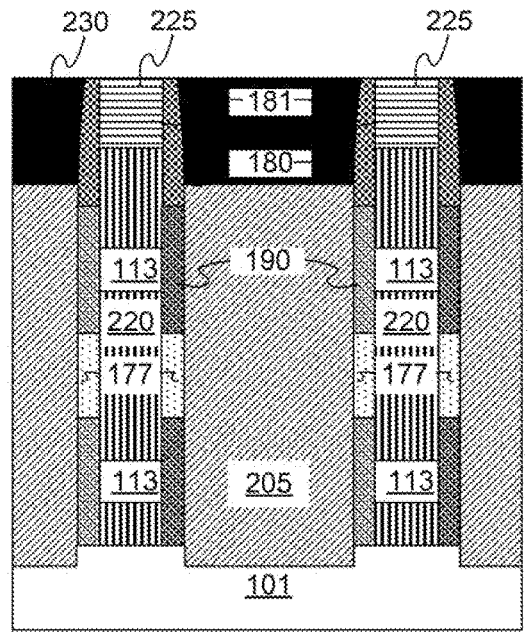
FIG. 12b is a cross-sectional depiction along the $X_2$ axis following gate deposition and contact formation, according to an example embodiment.
Figure 12C:
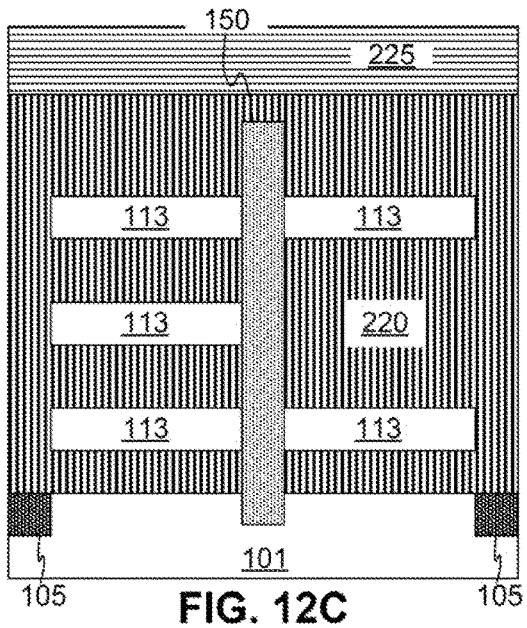
FIG. 12c is a cross-sectional depiction along the $Y_1$ axis following gate deposition and contact formation, according to an example embodiment.
Figure 12D:
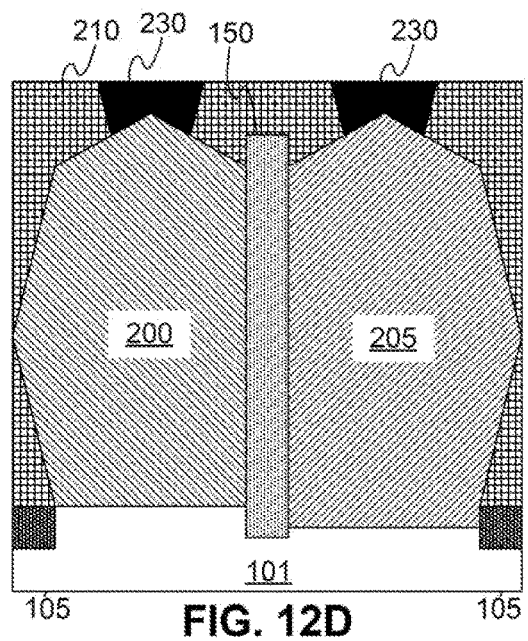
FIG. 12d is a cross-sectional depiction along the $Y_2$ axis following gate deposition and contact formation, according to an example embodiment.
Figure 13A:
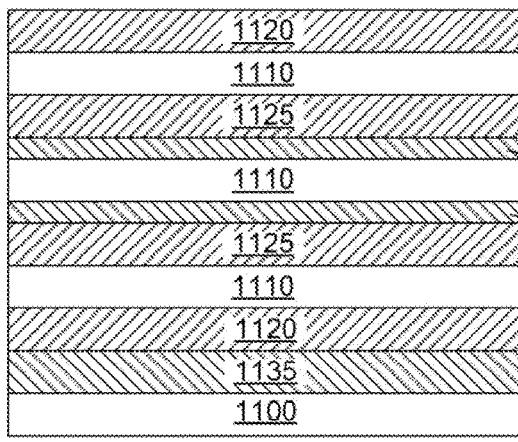
FIG. 13a is a cross-sectional depiction along the $X_1$ axis of a material stack, according to an example embodiment.
Figure 13B:
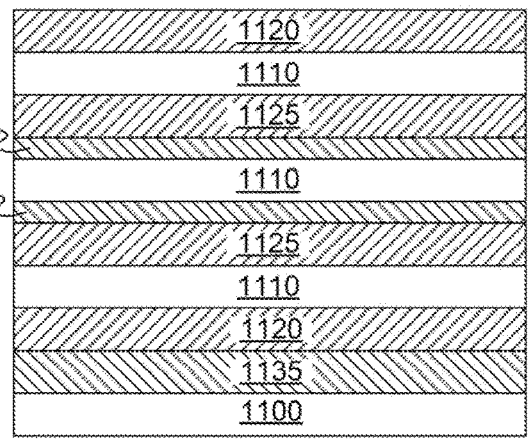
FIG. 13b is a cross-sectional depiction along the $X_2$ axis of a material stack, according to an example embodiment.
Figure 13C:
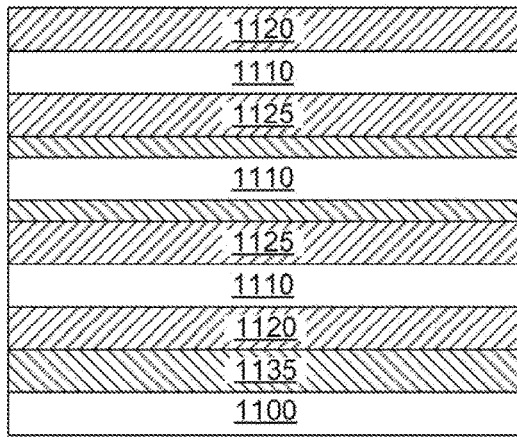
FIG. 13c is a cross-sectional depiction along the $Y_1$ axis of a material stack, according to an example embodiment.
Figure 13D:
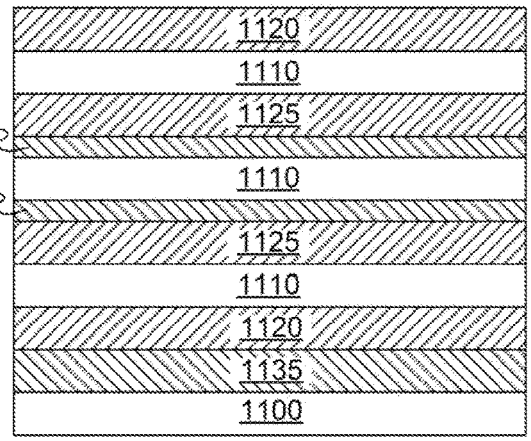
FIG. 13d is a cross-sectional depiction along the $Y_2$ axis of a material stack, according to an example embodiment.
Figure 14A:
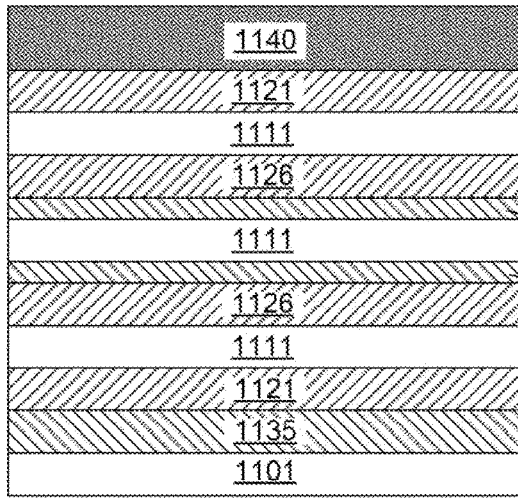
FIG. 14a is a cross-sectional depiction along the $X_1$ axis following STI formation, according to an example embodiment.
Figure 14B:
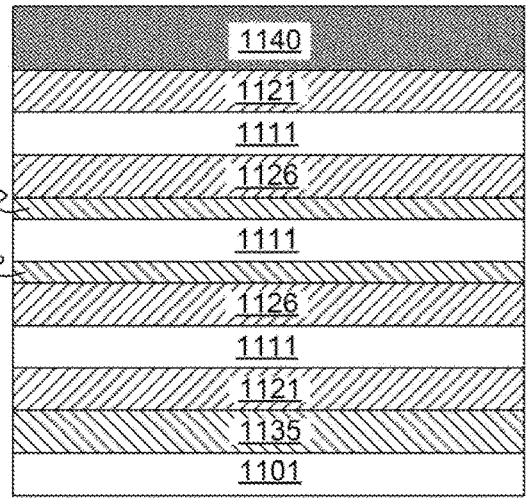
FIG. 14b is a cross-sectional depiction along the $X_2$ axis following STI formation, according to an example embodiment.
Figure 14C:
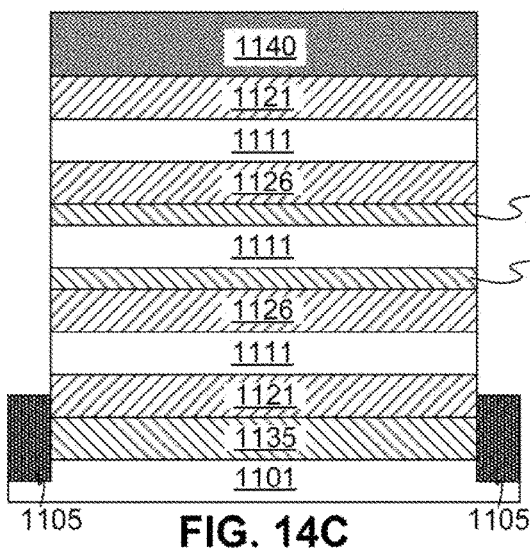
FIG. 14c is a cross-sectional depiction along the $Y_1$ axis following STI formation, according to an example embodiment.
Figure 14D:
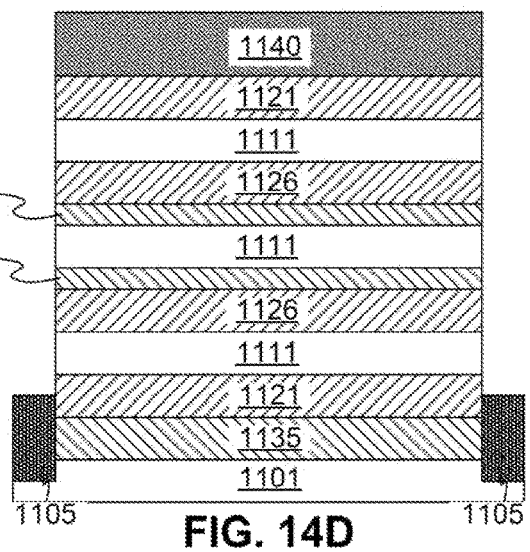
FIG. 14d is a cross-sectional depiction along the $Y_2$ axis following STI formation, according to an example embodiment.
Figure 15A:
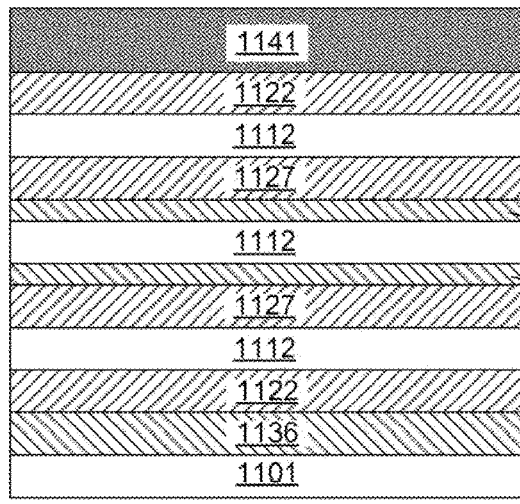
FIG. 15a is a cross-sectional depiction along the $X_1$ axis following dielectric pillar formation, according to an example embodiment.
Figure 15B:
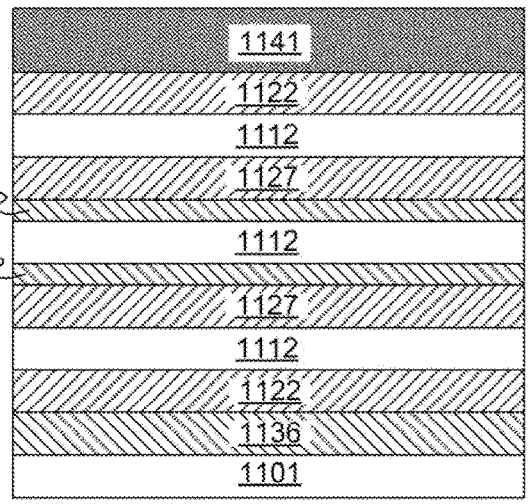
FIG. 15b is a cross-sectional depiction along the $X_2$ axis following dielectric pillar formation, according to an example embodiment.
Figure 15C:
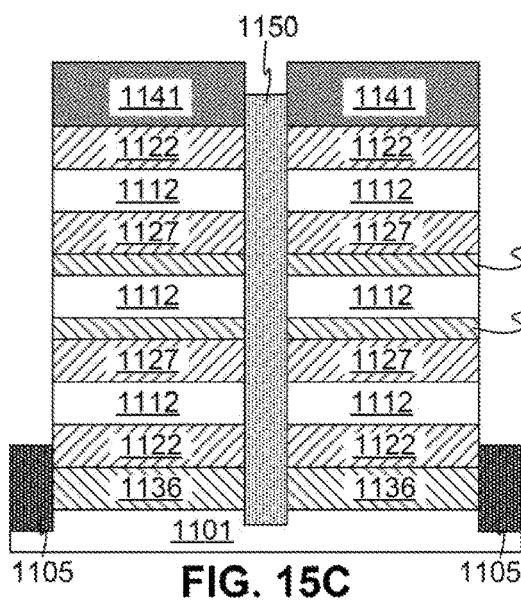
FIG. 15c is a cross-sectional depiction along the $Y_1$ axis following dielectric pillar formation, according to an example embodiment.
Figure 15D:
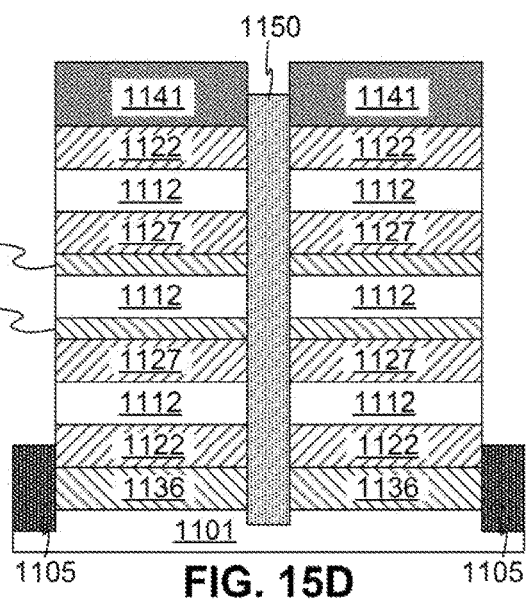
FIG. 15d is a cross-sectional depiction along the $Y_2$ axis following dielectric pillar formation, according to an example embodiment.
Figure 17A:
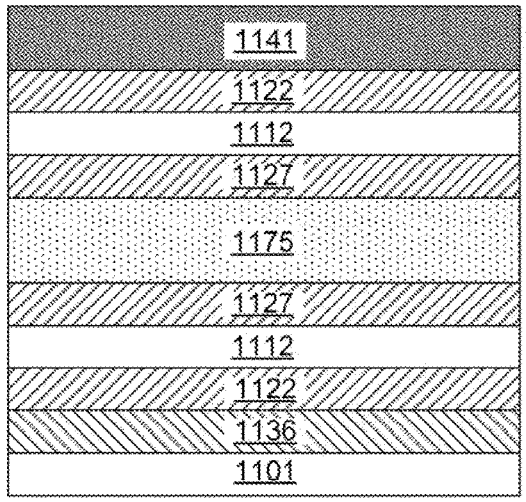
FIG. 17a is a cross-sectional depiction along the $X_1$ axis following removal of the hardmask and forming a dummy spacer where the semiconductor sheet was removed, according to an example embodiment.
Figure 17B:
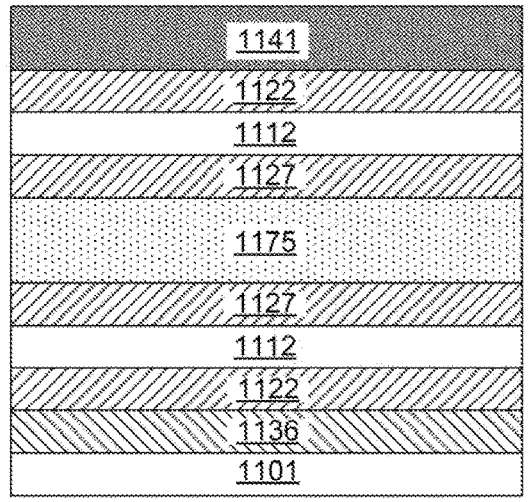
FIG. 17b is a cross-sectional depiction along the $X_2$ axis following removal of the hardmask and forming a dummy spacer where the semiconductor sheet was removed, according to an example embodiment.
Figure 17C:
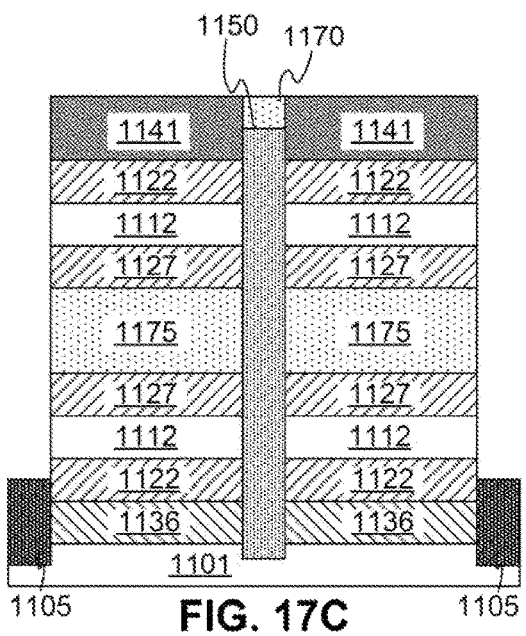
FIG. 17c is a cross-sectional depiction along the $Y_1$ axis following removal of the hardmask and forming a dummy spacer where the semiconductor sheet was removed, according to an example embodiment.
Figure 17D:
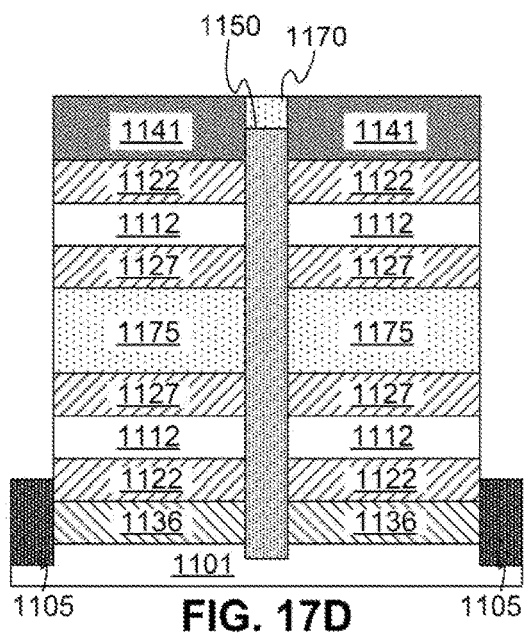
FIG. 17d is a cross-sectional depiction along the $Y_2$ axis following removal of the hardmask and forming a dummy spacer where the semiconductor sheet was removed, according to an example embodiment.
Figure 18A:
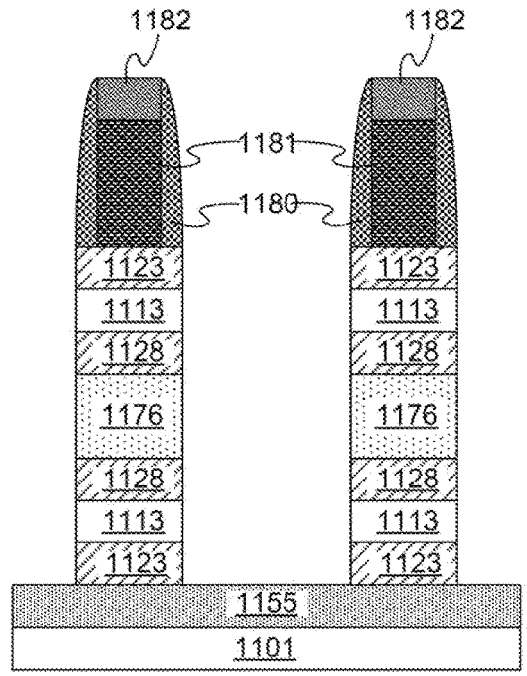
FIG. 18a is a cross-sectional depiction along the $X_1$ axis following forming a dummy gate and patterning the material stack, according to an example embodiment.
Figure 18B:
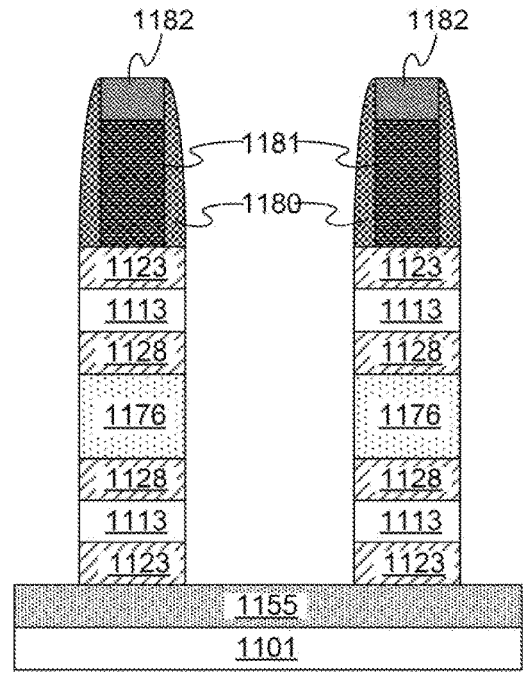
FIG. 18b is a cross-sectional depiction along the $X_2$ axis following forming a dummy gate and patterning the material stack, according to an example embodiment.
Figure 18C:
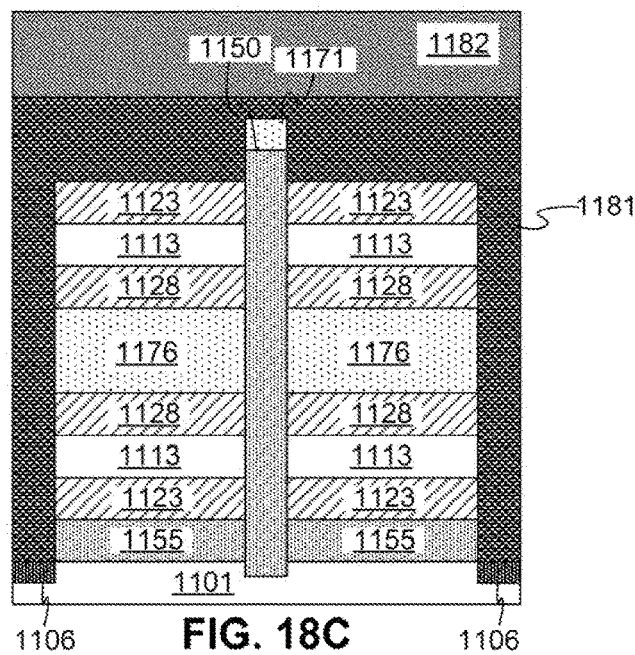
FIG. 18c is a cross-sectional depiction along the $Y_1$ axis following forming a dummy gate and patterning the material stack, according to an example embodiment.
Figure 18D:
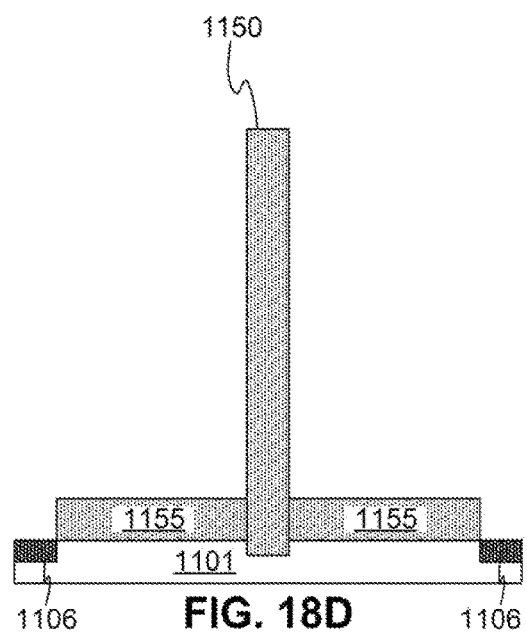
FIG. 18d is a cross-sectional depiction along the $Y_2$ axis following forming a dummy gate and patterning the material stack, according to an example embodiment.
Figure 20A:
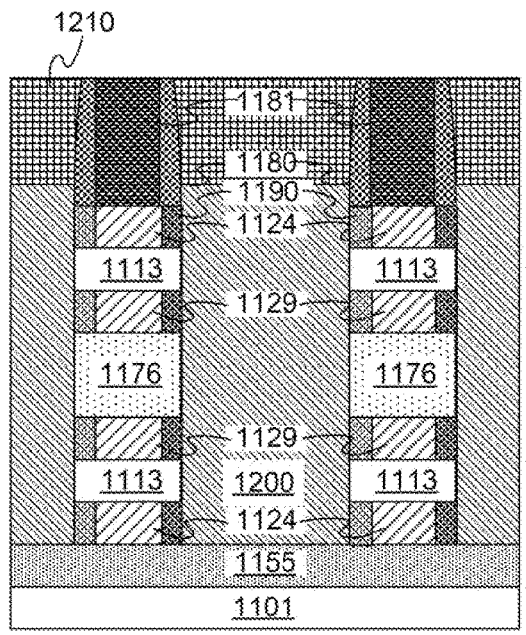
FIG. 20a is a cross-sectional depiction along the $X_1$ axis following epitaxial formation of source/drain regions, according to an example embodiment.
Figure 20B:
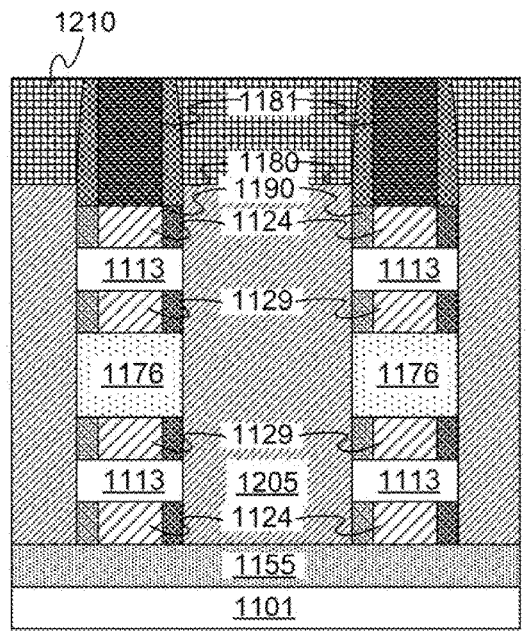
FIG. 20b is a cross-sectional depiction along the $X_2$ axis following epitaxial formation of source/drain regions, according to an example embodiment.
Figure 20C:
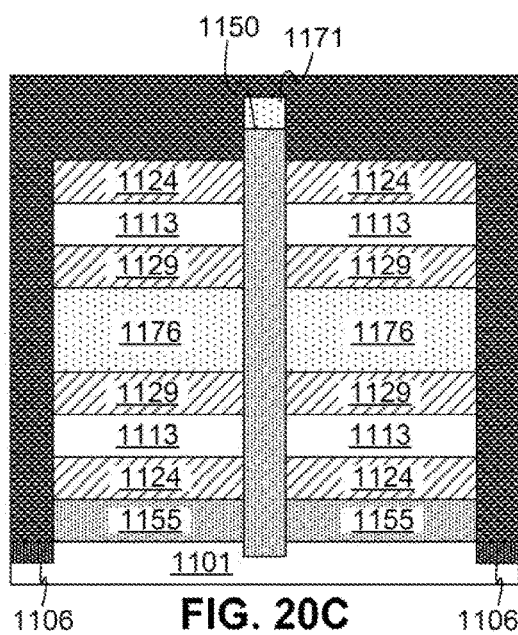
FIG. 20c is a cross-sectional depiction along the $Y_1$ axis following epitaxial formation of source/drain regions, according to an example embodiment.
Figure 20D:
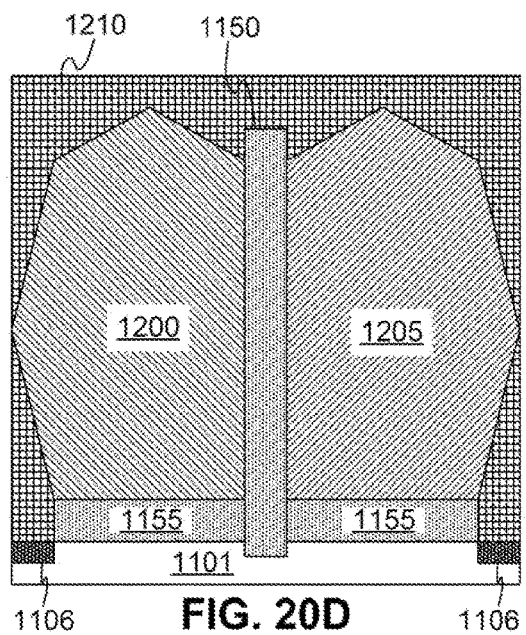
FIG. 20d is a cross-sectional depiction along the $Y_2$ axis following epitaxial formation of source/drain regions, according to an example embodiment.
Figure 21A:
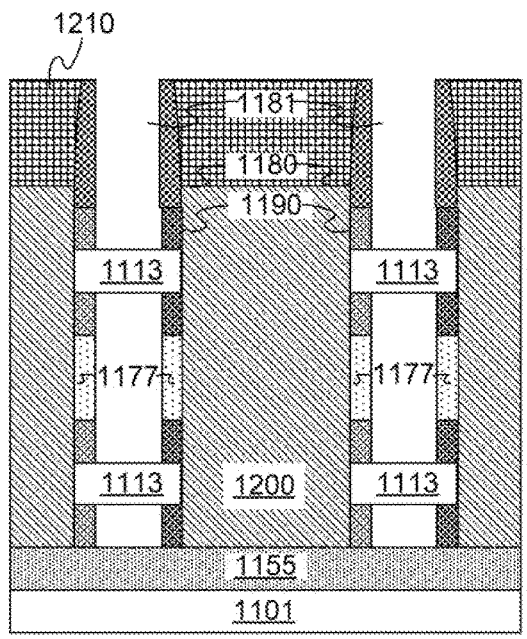
FIG. 21a is a cross-sectional depiction along the $X_1$ axis following removal of the dummy gate and dummy layers, according to an example embodiment.
Figure 21B:
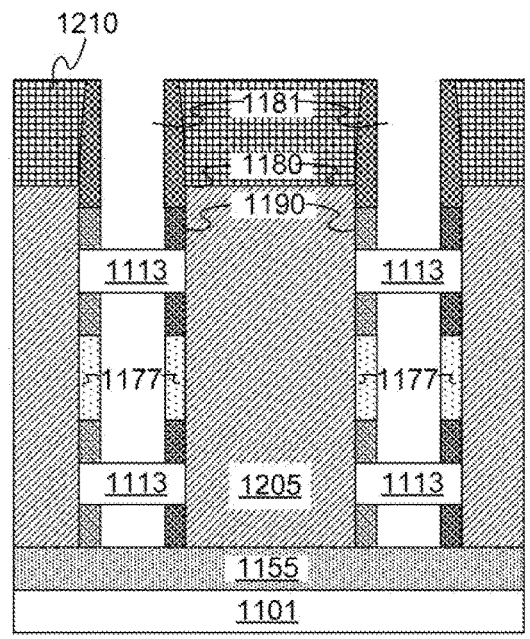
FIG. 21b is a cross-sectional depiction along the $X_2$ axis following removal of the dummy gate and dummy layers, according to an example embodiment.
Figure 21C:
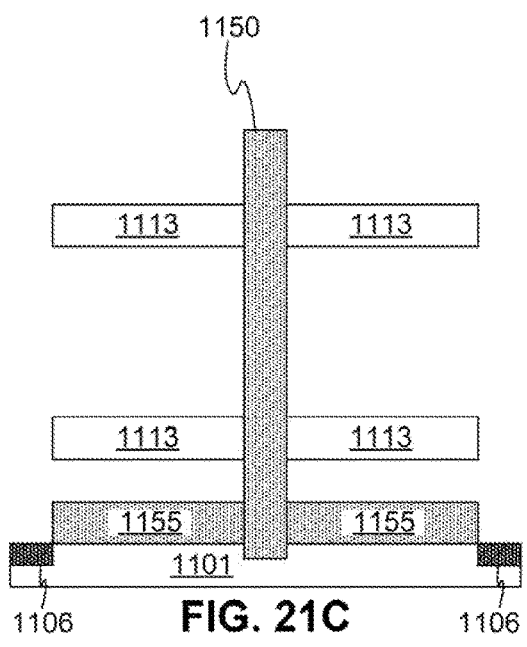
FIG. 21c is a cross-sectional depiction along the $Y_1$ axis following removal of the dummy gate and dummy layers, according to an example embodiment.
Figure 21D:
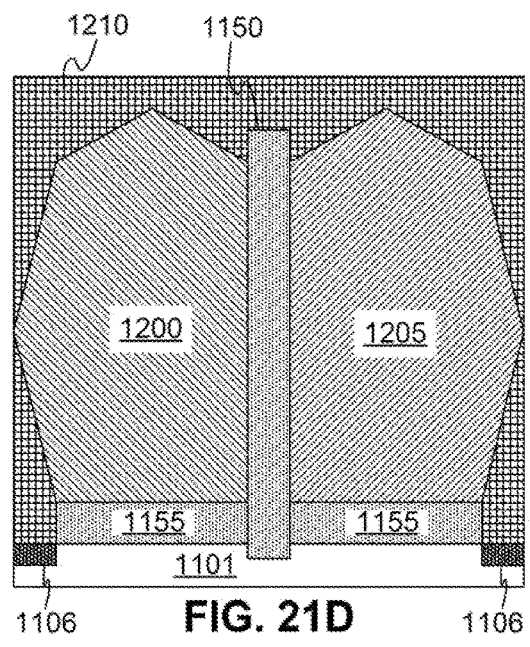
FIG. 21d is a cross-sectional depiction along the $Y_2$ axis following removal of the dummy gate and dummy layers, according to an example embodiment.
Figure 22A:
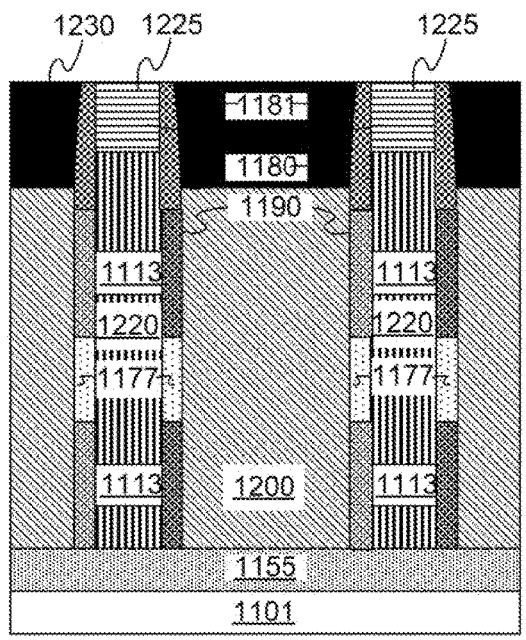
FIG. 22a is a cross-sectional depiction along the $X_1$ axis following gate deposition and contact formation, according to an example embodiment.
Figure 22B:
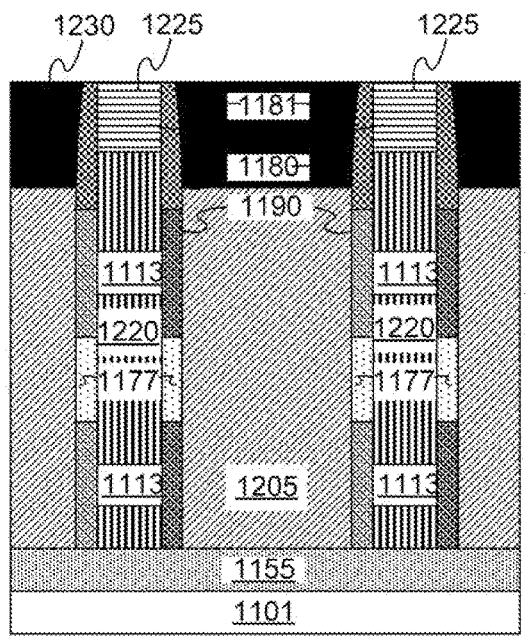
FIG. 22b is a cross-sectional depiction along the $X_2$ axis following gate deposition and contact formation, according to an example embodiment.
Figure 22C:
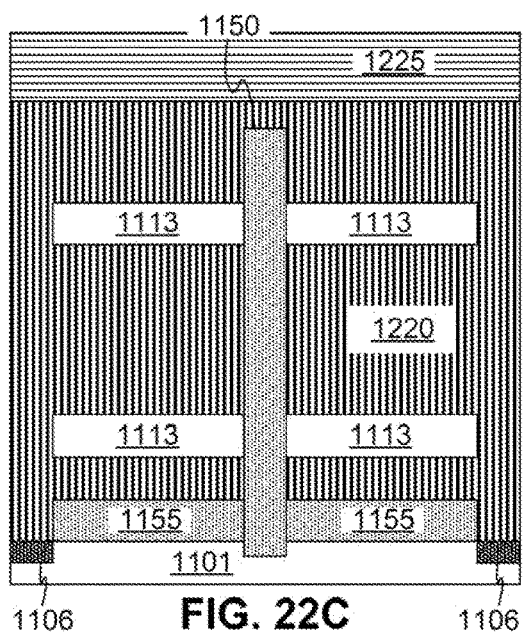
FIG. 22c is a cross-sectional depiction along the $Y_1$ axis following gate deposition and contact formation, according to an example embodiment.
Figure 22D:
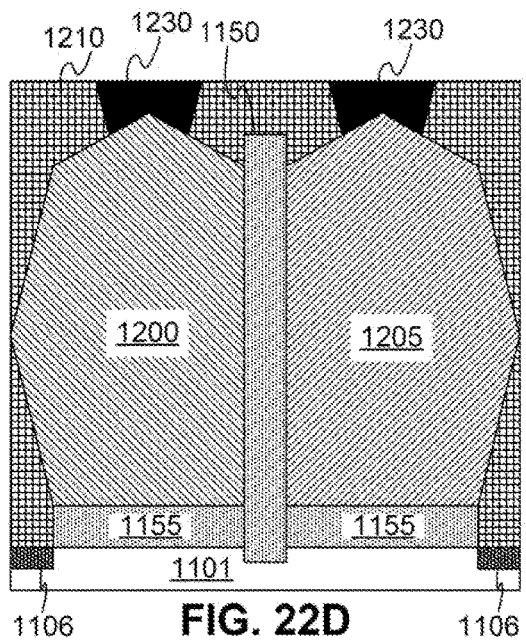
FIG. 22d is a cross-sectional depiction along the $Y_2$ axis following gate deposition and contact formation, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Example embodiments now will be described more fully herein with reference to the accompanying drawings, in which example embodiments are shown. This disclosure may, however, be embodied in many different forms and should not be construed as limited to the example embodiments set forth herein. Rather, these example embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Advanced nodes require to further shrinking of N-P space for cell height scaling. Unfortunately scaling N-P spaces below ~40 nm while enabling dual WFM integration is currently not possible based on limitations in patterning and lithography techniques limitations. To mitigate such issues, Fork-sheet architecture enables to unlock sub-40 nm N-P scaling. Some circuit elements require either matched or unmatched drive current ratios between nFETs and pFETs which were typically adjusted at the device level by tuning the effective width of devices. However, Standard integration for GAA or tri-gate devices with stacked channels typically allow only 1 vertical sheet-to-sheet space (suspension thickness) across wafer for all devices. This "1 size fits all" limitation can be impractical for the integration of devices requiring thicker gate stack such as EG device for example.

The process described herein detail a mechanism to selectively remove one or more nanosheets from a nanosheet stack, thereby enabling tuning of effective width ($W_{eff}$) on a device by device basis. This may be performed on a single forkFET (e.g., different $W_{eff}$ for each FET of the forkFET device) or may be done by region of the device to tune the $W_{eff}$ of different devices on a semiconductor chip.

Additionally, the process described herein may enable the use of different gate dielectrics on the devices. For example, removal of a nanosheet may enable the use of thicker dielectric on that portion of the device, thereby enabling differentiation between logic devices using, for example, thinner dielectrics, and I/O devices using, for example, thicker dielectrics.

Referring to FIG. 1, a top down depiction of the cross-sections of a semiconductor device along different areas of the device, according to an example embodiment. The top down view depicts a first region 10 and a second region 20. In an example embodiment, the first region 10 is a pFET region and the second region 20 is an nFET region. The top down view depicts a gate region 60, a source/drain region 50 and a dielectric region 70. The top down view contains four cross-sections, which are used for the following figures. The $X_1$ cross-section applies to each of the A figures. The $X_2$ cross-section applies to each of the B figures. The $Y_1$ cross-section applies to each of the C figures. The $Y_2$ cross-section applies to each of the D figures.

Referring to FIGS. 2a-d, a material stack is depicted, according to an example embodiment. the depicted structure may include one or more nanosheet stacks located on the substrate 100. According to an example embodiment, substrate 100 is a bulk semiconductor wafer, such as a bulk silicon (Si), bulk germanium (Ge), and/or bulk III-V semiconductor wafer. Alternatively, substrate 100 can be a semiconductor-on-insulator (SOI) wafer. SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 100 may already have pre-built structures (not shown) such as transistors, diodes, capacitors, resistors, interconnects, wiring, etc.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

The nanosheet stack includes alternating layers of a second nanosheet material 120 & 125 and a first nanosheet material 110, with a third nanosheet material 130 located on opposite sides of a nanosheet that may be removed later. For instance, according to an example embodiment, the first nanosheet material 110 is Si, the second nanosheet material 120 and 125 may be SiGe30 (i.e., Silicon-Germanium having 30% Germanium), and the third nanosheet material 130 may be SiGe60 (i.e., Silicon-Germanium having 60% Germanium). However, this is merely an example and other configurations are contemplated herein. As will be described in detail below, these nanosheet materials will be used to form the channels of the present stacked nanosheet devices and a sacrificial material in between the channels. Removal of the sacrificial material releases the channels from the stack and permits gates to be formed that fully surround the channels in a gate-all-around configuration. Thus, it is preferable that the first, second, and third nanosheet materials have etch selectivity with respect to one another. Thus, when one serves as the channels, the other sacrificial material can be selectively removed to release the channels from the stack. By way of example only, Si, SiGe30, and SiGe60 provide such etch selectivity. By 'sacrificial' it is meant that the layer, or portion thereof, is removed during fabrication of the device. By way of example only, each of the nanosheets 110, 120, 125, and 130 in nanosheet stack are deposited onto the substrate 100, one on top of the other, using an epitaxial growth process. According to an example embodiment, the second nanosheet material 120 and the first nanosheet material 110 in nanosheet stack has a thickness of from about 5 nanometers (nm) to about 25 nm and ranges therebetween. The third nanosheet material 130 has a thickness of from about 2 nm to about 15 nm and ranges therebetween. In an embodiment, a combined thickness of the second nanosheet material 125 and the third nanosheet material 130 may be substantially similar to the thickness of the second nanosheet material 120.

According to an example embodiment, sacrificial nanosheets 120, 125, and 130 are formed from SiGe having a high germanium (Ge) content. For example, in one exemplary embodiment, a high Ge content is from about 50% Ge to about 100% Ge (i.e., pure Ge) and ranges therebetween. For instance, in one non-limiting example, one of sacrificial nanosheets 120 and 125, or 130 is formed from SiGe60 (which has a Ge content of about 60%). Use of a higher Ge content SiGe will enable the sacrificial nanosheets 120, 125, and 130 to be etched selective to the first nanosheet 110 in nanosheet stack. Notably, however, the SiGe used as for the other sacrificial nanosheet material has a low Ge content. For example, in one exemplary embodiment, a low Ge content is from about 15% Ge to about 50% Ge and ranges therebetween. For instance, in one non-limiting example, second nanosheet material 120 & 125 is SiGe30 (which has a Ge content of about 30%), while third nanosheet material 130 is SiGE60.

Referring to FIGS. 3a-d patterning of the device using a hardmask 140 and forming STI 105 is depicted, according to an example embodiment. A hardmask 140 is formed on the nanosheets marking the footprint and location of at least one individual nanosheet device stack. Suitable materials for the nanosheet hardmask 140 include, but are not limited to, nitride materials such as silicon nitride ($Si_xN_y$), silicon oxynitride (SiON), and/or silicon carbonide nitride (SiCN), and/or oxide materials such as silicon oxide ($SiO_x$). The nanosheet hardmask 140 is then used to pattern nanosheet stack into at least one individual nanosheet device stack. Nanosheet device stack contains a patterned portion of each of the nanosheets from the originally deposited nanosheet stack, and patterning the region results in second nanosheet material 121 & 126 and a first nanosheet material 111, with a third nanosheet material 131. Shallow trench isolation (STI) regions 105 are then formed in the substrate 100 at the base of the nanosheet device stack. According to an example embodiment, STI regions 105 may be formed from an oxide material (also referred to herein as an "STI oxide") such as silicon oxide (SiOx). Although not explicitly shown in the figures, a liner (e.g., a thermal oxide or silicon nitride (SiN)) may be deposited prior to the STI oxide.

Referring to FIGS. 4a-d, the dielectric pillar 150 may be formed between the first region 10 and the second region 20, and thereby creating nanosheets 112, 122 & 127, and 132, as well as hardmask 141, according to an example embodiment. In forming the dielectric pillar 150, a pattern (e.g., a lithographic pattern) may be formed on top of the hardmask 140, and an anisotropic etch (e.g., RIE) may remove material in the exposed portion of the pattern to the substrate 101. Following removal of the hardmask material and nanosheet material from the stack, a dielectric pillar 150 may be formed in its place. The dielectric pillar may be a low-K dielectric such as, for example, SiBCN.

Referring to FIGS. 5a-d masking a first region is depicted, according to an example embodiment. A mask 160 is then formed on the nanosheets to protect a first region 10 of the device. In some embodiments, an OPL material 162 above a SiN liner 161 may be used with standard lithography and etching techniques (see above) can be employed to pattern the mask 160. Alternatively, a hardmask may be used as a mask 160 to protect the first region 10. It should be noted that the block mask may be formed over the entirety of other devices located on the substrate, while leaving some devices uncovered (e.g., FIGS. 13-22) in order to maintain some structures having more layers than others.

Referring to FIGS. 6a-d, removal of a semiconductor sheet from the material stack in the second region is depicted, according to an example embodiment. Removal of the semiconductor sheet 112 may begin by removing third nanosheet material 132 surrounding the semiconductor sheet 112 to be removed. This may be performed by using an isotropic etch that selectively removes the material for the third nanosheet material 132 with respect to the semiconductor sheet 112 and dummy sheet 122 & 127. Further, as the thickness of the third nanosheet material 132 may be small, it may require multiple etches, followed by rinses/washes, to completely removed the third nanosheet material. Following removal of the third nanosheet material 132, an isotropic etch of the semiconductor sheet 112 may be performed to complete remove the sheet (e.g., the center sheet in the example FIGS. 6a-6d). It should be noted that in the depicted embodiment, removal of the center semiconductor sheet 112 will also result in removal of a portion of the top and bottom semiconductor sheet 112 (not shown). However, as the center semiconductor sheet 112 has been exposed on 3 sides to the isotropic etching process, the entirety of the center semiconductor sheet 112 will be removed, as compared to only a portion of the top and bottom semiconductor sheet 112 which is removed as only a single surface of those sheets are exposed.

Referring to FIGS. 7a-d, removal of the mask and forming a dummy dielectric cap 170 above the dielectric pillar 150 and forming a dummy dielectric layer 175 where the semiconductor sheet 112 was removed is depicted, according to an example embodiment. A conformal process may be used to deposit a dielectric on the exposed surfaces of the structure, and an anisotropic etch may be performed to remove a portion of the deposited dielectric. Following this, a dummy dielectric layer 175 is located in the material stack and a dummy dielectric cap 170 is located above the dielectric pillar 150. In an example embodiment, the dielectric use may be, for example, SiCO.

Referring to FIGS. 8a-d, forming a dummy gate and patterning the material stack is depicted, according to an example embodiment. In such embodiments, the dummy gate layer may be made of any suitable sacrificial material, for example, amorphous or polycrystalline silicon. The dummy gate layer may have any thickness ranging from approximately 30 nm to approximately 200 nm. The dummy gate layer may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following deposition of the dummy gate layer a dummy gate structure, containing gate hardmask 182, dummy gate 181, and spacer 180, may be formed. Formation of the dummy gate structure may be accomplished by lithographic patterning of the desired gate regions, using for example a gate hardmask 182 as a pattern, and subsequently etching away the dummy gate layer from the unpatterned areas. Suitable lithographic materials include, for example, a photoresist layer. Etching may be accomplished by any suitable technique, such as, for example, reactive ion etching (RIE) or wet stripping. Suitable materials for dummy gate 181 include, but are not limited to, ploy-silicon (poly-Si) and/or amorphous silicon (a-Si). A process such as CVD, ALD or PVD can be employed to deposit the sacrificial gate material over the nanosheet device stack. Suitable materials for the gate hardmask 182 include, but are not limited to, nitride hardmask materials such as SiN, SiON and/or SiCN, and/or oxide hardmask materials such as SiOx.

After formation of the dummy gate 181, spacer 180 may be formed surrounding the gate hardmask 182 and dummy gate 181. The spacer 180 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The spacers may be made of an insulating material, such as, for example, silicon nitride, silicon oxide, silicon oxynitrides, or a combination thereof. The spacer 180 may be formed by any method known in the art, including depositing a conformal silicon nitride layer over the dummy gate 181 and removing unwanted material from the conformal silicon nitride layer using an anisotropic etching process such as, for example, reactive ion etching (RIE) or plasma etching (not shown). Methods of forming spacers are well-known in the art and other methods are explicitly contemplated. Further, in various embodiments, the spacer 180 may include one or more layers.

Still referring to FIGS. 8a-d, an anisotropic etch may be performed to remove material between each dummy gate structures. Following the anisotropic etch, only channel 113, gate dummy layer 123 & 128, gate sacrificial layer 133, and gate dummy dielectric 176 remain beneath the dummy gate structure. The anisotropic etch may be accomplished by any suitable technique, such as, for example, reactive ion etching (RIE). Additionally, it should be noted that due to the mismatched number of nanosheets, removal of the nanosheets in the source/drain region will lead to an over-etch of the substrate 101 in the second region 20.

Referring to FIGS. 9a-d, pullback of the dummy layers of the material stack and lower spacer formation is depicted, according to an example embodiment. A pullback of the gate dummy layer 123 & 128 and the gate sacrificial layer 133 is performed, creating gate dummy layer 123 & 128 and gate sacrificial layer 134. A selective etch is performed to recess gate dummy layer 123 & 128 exposed along the sidewalls of the nanosheet stack. This recess etch forms pockets along the sidewalls that are then filled with a spacer material. In the embodiment where gate dummy layer 123 & 128 and gate sacrificial layer 133 are SiGe, a SiGe-selective non-directional (isotropic) etching process can be used for the recess etch. Formation of bottom spacers 190 in the pullback region is then performed. Suitable materials for bottom spacers 190 include, but are not limited to, SiOx, SiC and/or SiCO. A process such as CVD, ALD or PVD can be employed to deposit the bottom spacers 190 alongside the gate dummy layer 124 & 129.

Referring to FIGS. 10a-d, epitaxial formation of source/drain regions is depicted, according to an example embodiment. formation and patterning of a first source/drain 200 and a second source/drain 205 is performed.

According to an example embodiment, lower source/drain are each formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With inner spacers 240 in place along the sidewall, epitaxial growth of the first source/drain 200 and second source/drain 205 is templated from the (exposed) ends of channel 113, respectively. As provided above, the nanosheets in the first region 10 may form a device of a first polarity, i.e., a PFET or an NFET, and the nanosheets in the second region 20 form a device of a second polarity, i.e., an NFET or a pFET, and selection of polarity may be based on the desired characteristics of the device being created. For instance, in one exemplary, non-limiting embodiment the nanosheets in first region 10 form a PFET whereby the first source/drain 200 contain a p-type dopant, and the nanosheets in second region 20 form an NFET whereby the second source/drain 205 contain an n-type dopant.

Namely, according to an example embodiment, a first (n- or p-type) doped epitaxial material is grown in trenches on opposite sides of the channels and then recessed to form the first source/drain 200. A directional (anisotropic) etching process such as RIE can be used to recess the first source/drain 200.

Referring to FIGS. 11a-d, according to an example embodiment removal of the dummy gate 181, gate sacrificial layer 134, and gate dummy layer 123 & 128 may occur. Additionally, gate dummy dielectric 176 may be removed in the gate region, leaving a dielectric spacer 177 within the bottom spacers 190, and having a seam between the dielectric spacer 177 and bottom spacers 190. Dummy gate 181 may be removed by any suitable etching process known in the art capable of selectively removing the dummy gate 181 without substantially removing material from the surrounding structures. In an example embodiment, the dummy gate 181 may be removed, for example, by a reactive ion etching (RIE) process capable of selectively removing silicon. The gate sacrificial layer 134 and gate dummy layer 123 & 128, now accessible through gate trenches, are then selectively removed. Removal of these nanosheets releases the channel 113. Namely, gaps are now present between the channel 113 in the channel region of the device. In this example, channel 113 will be used to form the channels of the device. The gate trenches and the gaps in the channel 113 enable replacement metal gates (RMGs), i.e., including a gate dielectric and at least one workfunction metal, to be formed that fully surround a portion of each of the nanosheet channels in a gate-all-around configuration.

Referring to FIGS. 12a-d, gate deposition and contact formation is depicted, according to an example embodiment. Formation of the RMG 220, sacrificial cap 225 and contacts 230 may occur. The RMG 220 may contain a gate dielectric, a work function metal and a metal contact. A conformal gate dielectric may be deposited into and lining each of the gate trenches and gaps in the channel region of the device. According to an example embodiment, gate dielectric is a high-κ material. The term "high-κ," as used herein, refers to a material having a relative dielectric constant κ which is much higher than that of silicon dioxide (e.g., a dielectric constant κ=25 for hafnium oxide (HfO2) rather than 4 for SiO2). Suitable high-κ gate dielectrics include, but are not limited to, HfO2 and/or lanthanum oxide ($La_2O_3$). A process such as CVD, ALD or PVD can be employed to deposit gate dielectric. According to an example embodiment, gate dielectric has a thickness of from about 1 nanometer (nm) to about 5 nm and ranges therebetween. A reliability anneal can be performed following deposition of gate dielectric. In an embodiment, the thickness of the gate dielectric in the depicted (unmasked) region may be thicker than that of the gate dielectric of the previously mentioned undepicted masked regions, which may enable formation of higher voltage devices such as I/O devices. In one embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

Following the deposition of the dielectric layer, in some embodiments a work function metal layer may be deposited. The work function metal layer may include, for example, aluminum, lanthanum oxide, magnesium oxide, strontium titanate, strontium oxide, TiN, TaN. The work function metal layer may be formed using any suitable metal deposition technique, including, for example, CVD, PVD, and ALD, sputtering, and plating. In some embodiments, a high temperature anneal may be performed prior to the deposition of the gate electrode.

A gate electrode may be deposited above the dielectric layer or work function layer. The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating. Additionally, a sacrificial cap 225 may fill the rest of the gate opening. The sacrificial cap 225 may be formed using any suitable deposition techniques including ALD, CVD, plasma enhanced CVD, spin on deposition, or PVD. The sacrificial cap 225 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. Following formation of RMG 220, a sacrificial cap 225 may be formed using any suitable dielectric.

Following the gate formation, trenches may be formed above the source drains and contacts 230 may be deposited. The contacts 230 may be deposited in the source/drain region. Contacts 230 may include, for example, copper, aluminum, titanium nitride, tantalum nitride or tungsten. The contacts 230 may be formed using a filing technique such as electroplating, electroless plating, chemical vapor deposition, physical vapor deposition or a combination of methods.

Referring to FIGS. 13a-d, a material stack is depicted, according to an example embodiment. the depicted structure may include one or more nanosheet stacks located on the substrate 1100. According to an example embodiment, substrate 1100 is a bulk semiconductor wafer, such as a bulk silicon (Si), bulk germanium (Ge), and/or bulk III-V semiconductor wafer. Alternatively, substrate 1100 can be a semiconductor-on-insulator (SOI) wafer. SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 1100 may already have pre-built structures (not shown) such as transistors, diodes, capacitors, resistors, interconnects, wiring, etc.

The term 'nanosheet,' as used herein, refers to a sheet or a layer having nanoscale dimensions. Further, the term 'nanosheet' is meant to encompass other nanoscale structures such as nanowires. For instance, 'nanosheet' can refer to a nanowire with a larger width, and/or 'nanowire' can refer to a nanosheet with a smaller width, and vice versa.

The nanosheet stack includes alternating layers of a second nanosheet material 1120 &1125 and a first nanosheet material 1110, with a third nanosheet material 1130 located on opposite sides of a nanosheet that may be removed later. These nanosheets may all be located on a bottom third nanosheet 1135. For instance, according to an example embodiment, the first nanosheet material 1110 is Si, the second nanosheet material 1120 & 1125 may be SiGe30 (i.e., Silicon-Germanium having 30% Germanium), and the third nanosheet material 1130 and bottom third nanosheet 1135 may be SiGe60 (i.e., Silicon-Germanium having 60% Germanium). However, this is merely an example and other configurations are contemplated herein. As will be described in detail below, these nanosheet materials will be used to form the channels of the present stacked nanosheet devices and a sacrificial material in between the channels. Removal of the sacrificial material releases the channels from the stack and permits gates to be formed that fully surround the channels in a gate-all-around configuration. Thus, it is preferable that the first, second, and third nanosheet materials have etch selectivity with respect to one another. Thus, when one serves as the channels, the other sacrificial material can be selectively removed to release the channels from the stack. By way of example only, Si, SiGe30, and SiGe60 provide such etch selectivity. By 'sacrificial' it is meant that the layer, or portion thereof, is removed during fabrication of the device. By way of example only, each of the nanosheets 1110, 1120, 1125, 1130, and 1135 in nanosheet stack are deposited onto the substrate 1100, one on top of the other, using an epitaxial growth process. According to an example embodiment, the second nanosheet material 1120 and the first nanosheet material 1110 in nanosheet stack has a thickness of from about 5 nanometers (nm) to about 25 nm and ranges therebetween. The third nanosheet material 1130 has a thickness of from about 2 nm to about 15 nm and ranges therebetween. In an embodiment, a combined thickness of the second nanosheet material 1125 and the third nanosheet material 1130 may be substantially similar to the thickness of the second nanosheet material 1120. Additionally, a bottom third nanosheet material 1135 has a thickness of from about 5 nm to about 25 nm and ranges therebetween.

According to an example embodiment, sacrificial nanosheets 1120, 1125, 1130, and 1135 are formed from SiGe having a high germanium (Ge) content. For example, in one exemplary embodiment, a high Ge content is from about 50% Ge to about 100% Ge (i.e., pure Ge) and ranges therebetween. For instance, in one non-limiting example, one pair of sacrificial nanosheets 1120 and 1125, or 1130 and 1135 are formed from SiGe60 (which has a Ge content of about 60%). Use of a higher Ge content SiGe will enable the sacrificial nanosheets 1120 and 1130 to be etched selective to the first nanosheet 1110 in nanosheet stack. Notably, however, the SiGe used as for the other sacrificial nanosheet material has a low Ge content. For example, in one exemplary embodiment, a low Ge content is from about 20% Ge to about 50% Ge and ranges therebetween. For instance, in one non-limiting example, second nanosheet material 1120 & 1125 is SiGe30 (which has a Ge content of about 30%), while third nanosheet material 1130 & 1135 is SiGE60.

Referring to FIGS. 14a-d patterning of the device using a hardmask 1140 and forming STI 1105 is depicted, according to an example embodiment. A hardmask 1140 is formed on the nanosheets marking the footprint and location of at least one individual nanosheet device stack. Suitable materials for the nanosheet hardmask 1140 include, but are not limited to, nitride materials such as silicon nitride ($Si_xN_y$), silicon oxynitride (SiON), and/or silicon carbonide nitride (SiCN), and/or oxide materials such as silicon oxide ($SiO_x$). The nanosheet hardmask 1140 is then used to pattern nanosheet stack into at least one individual nanosheet device stack. Nanosheet device stack contains a patterned portion of each of the nanosheets from the originally deposited nanosheet stack, and patterning the region results in second nanosheet material 1121 & 126 and a first nanosheet material 1111, with a third nanosheet material 1131. Shallow trench isolation (STI) regions 1105 are then formed in the substrate 1100 at the base of the nanosheet device stack. According to an example embodiment, STI regions 1105 may be formed from an oxide material (also referred to herein as an "STI oxide") such as silicon oxide (SiOx). Although not explicitly shown in the figures, a liner (e.g., a thermal oxide or silicon nitride (SiN)) may be deposited prior to the STI oxide. STI regions 1105 may initially be formed above bottom third nanosheet material 1135 in order to protect it prior to removal and replacement with BDI.

Referring to FIGS. 15a-d, the dielectric pillar 1150 may be formed between the first region 10 and the second region 20, and thereby creating nanosheets 1112, 1122 & 1127, and 1132, as well as hardmask 1141, according to an example embodiment. In forming the dielectric pillar 1150, a pattern (e.g., a lithographic pattern) may be formed on top of the hardmask 1140, and an anisotropic etch (e.g., RIE) may remove material in the exposed portion of the pattern to the substrate 1101. Following removal of the hardmask material and nanosheet material from the stack, a dielectric pillar 1150 may be formed in its place. The dielectric pillar may be a low-K dielectric such as, for example, SiBCN.

An optional masking a portion of the semiconductor structure (not shown) may be performed, according to an example embodiment. This may be accomplished similar to the block mask of FIGS. 5a-5d by partially covering a device located on the substrate, and/or may be formed over the entirety of other devices located on the substrate, while leaving the currently depicted device uncovered in order to have some structures with more layers than others.

Referring to FIGS. 16a-d, removal of a semiconductor sheet from the material stack in the second region is depicted, according to an example embodiment. Removal of the semiconductor sheet 1112 may begin by removing third nanosheet material 1132 surrounding the semiconductor sheet 1112 to be removed. This may be performed by using an isotropic etch that selectively removes the material for the third nanosheet material 1132 with respect to the semiconductor sheet 1112 and dummy sheet 1122 & 1127. Further, as the thickness of the third nanosheet material 1132 may be small, it may require multiple etches, followed by rinses/washes, to completely removed the third nanosheet material. Following removal of the third nanosheet material 1132, an isotropic etch of the semiconductor sheet 1112 may be performed to complete remove the sheet (e.g., the center sheet in the example FIGS. 6a-6d). It should be noted that in the depicted embodiment, removal of the center semiconductor sheet 1112 will also result in removal of a portion of the top and bottom semiconductor sheet 1112 (not shown). However, as the center semiconductor sheet 1112 has been exposed on 3 sides to the isotropic etching process, the entirety of the center semiconductor sheet 1112 will be removed, as compared to only a portion of the top and bottom semiconductor sheet 1112 which is removed as only a single surface of those sheets are exposed. Following the removal of the semiconductor sheet, the optional blockmask may also be removed.

Referring to FIGS. 17a-d, forming a dummy dielectric cap 1170 above the dielectric pillar 1150 and forming a dummy dielectric layer 1175 where the semiconductor sheet 1112 was removed is depicted, according to an example embodiment. A conformal process may be used to deposit a dielectric on the exposed surfaces of the structure, and an anisotropic etch may be performed to remove a portion of the deposited dielectric. Following this, a dummy dielectric layer 1175 is located in the material stack and a dummy dielectric cap 1170 is located above the dielectric pillar 1150. In an example embodiment, the dielectric use may be, for example, SiCO.

Referring to FIGS. 18a-d, forming a dummy gate and patterning the material stack is depicted, according to an example embodiment. Prior to this, removal of the hardmask 1141 and recess of the STI 1105 into STI 1106 may be performed. In such embodiments, the dummy gate layer may be made of any suitable sacrificial material, for example, amorphous or polycrystalline silicon. The dummy gate layer may have any thickness ranging from approximately 30 nm to approximately 1200 nm. The dummy gate layer may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Following deposition of the dummy gate layer a dummy gate structure, containing gate hardmask 1182, dummy gate 1181, spacer 1180, and BDI 1155 may be formed. Formation of the dummy gate structure may be accomplished by lithographic patterning of the desired gate regions, using for example a gate hardmask 1182 as a pattern, and subsequently etching away the dummy gate layer from the unpatterned areas. Suitable lithographic materials include, for example, a photoresist layer. Etching may be accomplished by any suitable technique, such as, for example, reactive ion etching (RIE) or wet stripping. Suitable materials for dummy gate 1181 include, but are not limited to, ploy-silicon (poly-Si) and/or amorphous silicon (a-Si). A process such as CVD, ALD or PVD can be employed to deposit the sacrificial gate material over the nanosheet device stack. Suitable materials for the gate hardmask 1182 include, but are not limited to, nitride hardmask materials such as SiN, SiON and/or SiCN, and/or oxide hardmask materials such as SiOx.

After formation of the dummy gate 1181, spacer 1180 may be formed surrounding the gate hardmask 1182 and dummy gate 1181 and BDI 1155 may be formed between the channel layers and the substrate 1101. The bottom third material layer 1136 may be selectively removed prior to deposition of a conformal material. The spacer 1180 may be made of any insulating material, such as silicon nitride, silicon oxide, silicon oxynitrides, or a combination thereof, and may have a thickness ranging from 2 nm to approximately 100 nm, preferably approximately 2 nm to approximately 25 nm. The spacers may be made of an insulating material, such as, for example, silicon nitride, silicon oxide, silicon oxynitrides, or a combination thereof. The spacer 1180 may be formed by any method known in the art, including depositing a conformal silicon nitride layer over the dummy gate 1181, and beneath the material layers to form BDI 1155 and removing unwanted material from the conformal silicon nitride layer using an anisotropic etching process such as, for example, reactive ion etching (RIE) or plasma etching (not shown). Methods of forming spacers are well-known in the art and other methods are explicitly contemplated. Further, in various embodiments, the spacer 1180 may include one or more layers.

Still referring to FIGS. 18a-d, an anisotropic etch may be performed to remove material between each dummy gate structures. Following the anisotropic etch, only channel 1113, gate dummy layer 1123 & 1128, gate sacrificial layer 1133, and gate dummy dielectric 1176 remain beneath the dummy gate structure. The anisotropic etch may be accomplished by any suitable technique, such as, for example, reactive ion etching (RIE).

Referring to FIGS. 19a-d, pullback of the dummy layers of the material stack and lower spacer formation is depicted, according to an example embodiment. A pullback of the gate dummy layer 1123 & 1128 and the gate sacrifical layer 1133 is performed, creating gate dummy layer 1123 & 1128 and gate sacrifical layer 1134. A selective etch is performed to recess gate dummy layer 1123 & 1128 exposed along the sidewalls of the nanosheet stack. This recess etch forms pockets along the sidewalls that are then filled with a spacer material. In the embodiment where gate dummy layer 1123 & 1128 and gate sacrifical layer 1133 are SiGe, a SiGe-selective non-directional (isotropic) etching process can be used for the recess etch. Formation of bottom spacers 1190 in the pullback region is then performed. Suitable materials for bottom spacers 1190 include, but are not limited to, SiOx, SiC and/or SiCO. A process such as CVD, ALD or PVD can be employed to deposit the bottom spacers 1190 alongside the gate dummy layer 1124 & 129.

Referring to FIGS. 20a-d, epitaxial formation of source/drain regions is depicted, according to an example embodiment. formation and patterning of a first source/drain 1200, and a second source/drain 1205 is performed. First source/drain 1200 are then formed in the trenches on opposite sides of the channel 1113.

According to an example embodiment, lower source/drain are each formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). With inner spacers 1240 in place along the sidewall, epitaxial growth of the first source/drain 1200 and second source/drain 1205 is templated from the (exposed) ends of channel 1113, respectively.

Namely, according to an example embodiment, a first (n- or p-type) doped epitaxial material is grown in trenches on opposite sides of the channels and then recessed to form the first source/drain 1200. A directional (anisotropic) etching process such as RIE can be used to recess the first source/drain 1200.

Referring to FIGS. 21a-d, removal of the dummy gate and dummy layers is depicted, according to an example embodiment. removal of the dummy gate 1181, gate sacrifical layer 1134, and gate dummy layer 1123 & 1128 may occur. Dummy gate 1181 may be removed by any suitable etching process known in the art capable of selectively removing the dummy gate 1181 without substantially removing material from the surrounding structures. In an example embodiment, the dummy gate 1181 may be removed, for example, by a reactive ion etching (RIE) process capable of selectively removing silicon. The gate sacrifical layer 1134 and gate dummy layer 1123 & 1128, now accessible through gate trenches, are then selectively removed. Removal of these nanosheets releases the channel 1113. Namely, gaps are now present between the channel 1113 in the channel region of the device. In this example, channel 1113 will be used to form the channels of the device. The gate trenches and the gaps in the channel 1113 enable replacement metal gates (RMGs), i.e., including a gate dielectric and at least one workfunction metal, to be formed that fully surround a portion of each of the nanosheet channels in a gate-all-around configuration.

Referring to FIGS. 22a-d, gate deposition and contact formation is depicted, according to an example embodiment. Formation of the RMG 1220, sacrificial cap 1225 and contacts 1230 may occur. The RMG 1220 may contain a gate dielectric, a work function metal and a metal contact. A conformal gate dielectric may be deposited into and lining each of the gate trenches and gaps in the channel region of the device. According to an example embodiment, gate dielectric is a high-κ material. The term "high-κ," as used herein, refers to a material having a relative dielectric constant κ which is much higher than that of silicon dioxide (e.g., a dielectric constant κ=25 for hafnium oxide (HfO2) rather than 4 for SiO2). Suitable high-κ gate dielectrics include, but are not limited to, HfO2 and/or lanthanum oxide ($La_2O_3$). A process such as CVD, ALD or PVD can be employed to deposit gate dielectric. According to an example embodiment, gate dielectric has a thickness of from about 1 nanometer (nm) to about 5 nm and ranges therebetween. In an embodiment, the thickness of the gate dielectric in the depicted (unmasked) region may be thicker than that of the gate dielectric of the previously mentioned undepicted masked regions, which may enable formation of higher voltage devices such as I/O devices. A reliability anneal can be performed following deposition of gate dielectric. In one embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

A gate electrode may be deposited above the dielectric layer or work function layer. The gate electrode may be made of gate conductor materials including, but not limited to, zirconium, tungsten, tantalum, hafnium, titanium, aluminum, ruthenium, metal carbides, metal nitrides, transition metal aluminides, tantalum carbide, titanium carbide, tantalum magnesium carbide, or combinations thereof. The gate electrode may be formed using any suitable metal deposition technique, including, for example, CVD, PVD, and ALD, sputtering, and plating. Additionally, a sacrificial cap 1225 may fill the rest of the gate opening. The sacrificial cap 1225 may be formed using any suitable deposition techniques including ALD, CVD, plasma enhanced CVD, spin on deposition, or PVD. The sacrificial cap 1225 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. Following formation of RMG 1220, a sacrificial cap 1225 may be formed using any suitable dielectric.

Following the gate formation, trenches may be formed above the source drains and contacts 1230 may be deposited. The contacts 1230 may be deposited in the source/drain region. Contacts 1230 may include, for example, copper, aluminum, titanium nitride, tantalum nitride or tungsten. The contacts 1230 may be formed using a filing technique such as electroplating, electroless plating, chemical vapor deposition, physical vapor deposition or a combination of methods.

It should be noted that elements of the embodiment of FIGS. 2-12 and FIGS. 13-22 can be performed together or may be interchangeable. For example, the steps forming the BDI layer in FIGS. 13-22 may be used in FIGS. 2-12. Additionally, structures may have various degrees of masking such as partial masking (FIGS. 2-12), no masking (FIGS. 13-22) or full masking (not shown), which may enable a single device to include multiple various structures according to the teachings of the included process (e.g., selective removal of one or more sheets from a device), which may enable tuning of $W_{eff}$ of different electrical devices on a semiconductor chip or integrating different gate dielectric thicknesses to enable I/O devices with logic devices on the chip.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor device comprising:
   a first FET and a second FET separated by a vertical dielectric pillar;
   wherein the first FET comprises a first plurality of horizontal sheet channels;
   wherein the second FET comprises a second plurality of horizontal sheet channels;
   wherein a first top sheet of the first plurality of horizontal sheet channels and a second top sheet of the second plurality of horizontal sheet channels are substantially coplanar;

wherein a first bottom sheet of the first plurality of horizontal sheet channels and a second bottom sheet of the second plurality of horizontal sheet channels are substantially coplanar; and wherein the first plurality of horizontal sheet channels contains more horizontal sheets than the second plurality of horizontal sheet channels.

2. The device of claim 1, further comprising a bottom dielectric isolation layer located beneath first FET and the second FET, and wherein the bottom dielectric isolation layer is in contact with the vertical dielectric pillar.

3. The device of claim 1, wherein a bottom spacer of the second FET comprises at least one material seam in a dielectric of the bottom spacer.

4. The device of claim 1, wherein the first FET comprises a pFET device, and wherein the second FET comprises an nFET device.

5. The device of claim 1, wherein a first thickness of a first gate dielectric on the first FET is less than a second thickness of a second gate dielectric on the second FET.

6. The device of claim 1, wherein a first surface of a substrate located beneath a first source/drain region of the first FET is higher than a second surface of the substrate located beneath a second source/drain region of the second FET.

7. A semiconductor device comprising:
a first FET device and a second FET device;
wherein the first FET device comprises a first plurality of horizontal sheet channels;
wherein the second FET device comprises a second plurality of horizontal sheet channels separated by a vertical dielectric pillar;
wherein a first top sheet of the first plurality of horizontal sheet channels and a second top sheet of the second plurality of horizontal sheet channels are substantially coplanar;
wherein a first bottom sheet of the first plurality of horizontal sheet channels and a second bottom sheet of the second plurality of horizontal sheet channels are substantially coplanar; and
wherein the first plurality of horizontal sheet channels contains more horizontal sheets than the second plurality of horizontal sheet channels.

8. The device of claim 7, further comprising a bottom dielectric isolation layer located beneath first FET device and the second FET device, and wherein the bottom dielectric isolation layer is in contact with the vertical dielectric pillar of the second FET device.

9. The device of claim 7, wherein a bottom spacer of the second FET device comprises at least one material seam in a dielectric of the bottom spacer.

10. The device of claim 7, wherein the first FET device is a pFET device, and wherein the second FET device is an nFET device.

11. The device of claim 7, wherein a first thickness of a first gate dielectric on the first FET is less than a second thickness of a second gate dielectric on the second FET.

12. A method of forming a semiconductor device comprising:

removing a layer of a plurality of material layers from a material stack, wherein the layer is between two material layers, and wherein the layer is the same material as a layer retained in the material stack;

forming a dummy gate above a gate region of the material stack;

removing the second material and the third material in the gate region; and forming a replacement metal gate around the plurality of first layers remaining, wherein the material stack comprises a plurality first layers of a first material, a plurality of second layers of a second material, and a plurality of third layers of a third material, wherein the first material, the second material, and the third material are different materials, and wherein the layer is from the plurality of first layers.

13. The method of claim 12, and two layers of the plurality of third layers are located in direct contact above and below the first layer.

14. The method of claim 13, wherein removing the layer comprises:
removing the two layers of the plurality of third layers; and
removing the layer.

15. A method of forming a semiconductor device comprising:
forming a dielectric material in a material stack, wherein the material stack comprises a plurality of material layers;
masking a first side of the material stack;
removing a layer of the plurality of material layers from the material stack on a second side, wherein the layer is the same material as a layer retained in the material stack;
forming a dummy gate above a gate region of the material stack;
removing the second material and the third material in the gate region; and
forming a replacement metal gate around the plurality of first layers remaining,
wherein the material stack comprises a plurality first layers of a first material, a plurality of second layers of a second material, and a plurality of third layers of a third material, wherein the first material, the second material, and the third material are different materials, and wherein the layer is from the plurality of first layers.

16. The method of claim 15, and two layers of the plurality of third layers are located in direct contact above and below the first layer.

17. The method of claim 16, wherein removing the layer comprises:
removing the two layers of the plurality of third layers; and
removing the layer.

* * * * *